US011367820B2

(12) United States Patent
Kim et al.

(10) Patent No.: US 11,367,820 B2
(45) Date of Patent: Jun. 21, 2022

(54) LIGHT EMITTING DEVICE PACKAGE AND LIGHT SOURCE DEVICE

(71) Applicant: SUZHOU LEKIN SEMICONDUCTOR CO., LTD., Taicang (CN)

(72) Inventors: Young Shin Kim, Seoul (KR); June O Song, Seoul (KR); Chang Man Lim, Seoul (KR); Won Jung Kim, Seoul (KR); Ki Seok Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 13 days.

(21) Appl. No.: 16/643,099

(22) PCT Filed: Aug. 31, 2018

(86) PCT No.: PCT/KR2018/010113
§ 371 (c)(1),
(2) Date: Feb. 28, 2020

(87) PCT Pub. No.: WO2019/045506
PCT Pub. Date: Mar. 7, 2019

(65) Prior Publication Data
US 2020/0350474 A1 Nov. 5, 2020

(30) Foreign Application Priority Data

Sep. 1, 2017 (KR) .................. 10-2017-0112124
Sep. 12, 2017 (KR) .................. 10-2017-0116588

(51) Int. Cl.
*H01L 33/62* (2010.01)
*H01L 33/48* (2010.01)
(Continued)

(52) U.S. Cl.
CPC ............ *H01L 33/62* (2013.01); *H01L 33/486* (2013.01); *H01L 33/56* (2013.01); *H01L 33/60* (2013.01); *H01L 2933/0033* (2013.01)

(58) Field of Classification Search
CPC ....... H01L 33/62; H01L 33/486; H01L 33/56; H01L 33/60; H01L 2933/0033
See application file for complete search history.

(56) References Cited

U.S. PATENT DOCUMENTS

2001/0022390 A1* 9/2001 Waitl .................. H01L 31/0203
257/666
2005/0051785 A1* 3/2005 Erchak .................. B82Y 20/00
257/98
(Continued)

FOREIGN PATENT DOCUMENTS

JP 2000-049415 2/2000
JP 2009-099716 5/2009
(Continued)

OTHER PUBLICATIONS

International Search Report dated Dec. 17, 2018 issued in Application No. PCT/KR2018/010113.

*Primary Examiner* — Feifei Yeung Lopez
(74) *Attorney, Agent, or Firm* — Birch, Stewart, Kolasch & Birch, LLP

(57) ABSTRACT

The light emitting device package disclosed in the embodiment includes first and second frames spaced apart from each other; a body disposed between the first and second frames; a light emitting device including a first bonding portion and a second bonding portion on a lower portion thereof; and a first resin disposed between the body and the light emitting device, wherein the first frame includes a first protruding portion facing the first bonding portion of the light emitting device, and the second frame includes a second protruding portion facing the second bonding portion of the light emitting device, and including a first conductive layer between the first bonding portion and the first protruding portion and a second conductive layer between the second bonding portion and the second protruding portion.

12 Claims, 17 Drawing Sheets

(51) Int. Cl.
*H01L 33/56* (2010.01)
*H01L 33/60* (2010.01)

(56) References Cited

U.S. PATENT DOCUMENTS

| | | | | |
|---|---|---|---|---|
| 2007/0272938 | A1* | 11/2007 | Maeda | H01L 33/60 257/99 |
| 2010/0314654 | A1* | 12/2010 | Hayashi | H01L 33/486 257/99 |
| 2011/0049552 | A1 | 3/2011 | Pyeon et al. | |
| 2013/0037842 | A1* | 2/2013 | Yamada | H01L 33/483 257/98 |
| 2013/0193464 | A1* | 8/2013 | Bae | H01L 33/62 257/94 |
| 2014/0217438 | A1* | 8/2014 | Tomizawa | H01L 33/486 257/98 |
| 2015/0021642 | A1 | 1/2015 | Nakabayashi | |
| 2015/0348906 | A1* | 12/2015 | Park | H01L 33/486 257/774 |
| 2020/0274042 | A1* | 8/2020 | Lee | H01L 33/62 |

FOREIGN PATENT DOCUMENTS

| | | |
|---|---|---|
| JP | 2015-038963 | 2/2015 |
| KR | 10-2009-0069146 | 6/2009 |
| KR | 10-2015-0109807 | 10/2015 |

* cited by examiner

LIGHT EMITTING DEVICE PACKAGE AND LIGHT SOURCE DEVICE

CROSS-REFERENCE TO RELATED PATENT APPLICATIONS

This application is a U.S. National Stage Application under 35 U.S.C. § 371 of PCT Application No. PCT/KR2018/010113, filed Aug. 31, 2018, which claims priority to Korean Patent Application Nos. 10-2017-0112124, filed Sep. 1, 2017 and 10-2017-0116588, filed Sep. 12, 2017, whose entire disclosures are hereby incorporated by reference.

FIELD OF THE INVENTION

The embodiment relates to a light emitting device package, a semiconductor device package, a method of manufacturing a semiconductor device package, and a light source device.

BACKGROUND ART

A semiconductor device including a compound such as GaN, AlGaN and the like may have many merits such as wide and easily adjustable band gap energy, so that the semiconductor device may be used variously as a light emitting device, a light receiving device, various diodes, and the like.

Specifically, as thin film growth technology and device materials have been developed, a light emitting device, such as a light emitting diode or a laser diode, using a Group III-V or II-VI compound semiconducting material has an advantage capable of realizing light of various wavelength bands such as red, green, blue, and ultraviolet light. In addition, a light emitting device, such as a light emitting diode or a laser diode, using a Group III-V or II-VI compound semiconducting material may realize a white light source with high efficiency by using a fluorescent material or by combining colors. Such a light emitting device has advantages of low power consumption, semi-permanent lifetime, a fast response speed, safety, and environmental friendliness as compared with a conventional light source such as a fluorescent lamp, an incandescent lamps, or the like.

In addition, when a light-receiving device such as a photodetector or a solar cell is fabricated by using a Group III-V or Group II-VI compound semiconductor material, since the material of the device material has been developed, light in various wavelength ranges is absorbed to generate optical current, so that light of various wavelength ranges from gamma rays to radio wavelength regions may be used. Further, such a light receiving device may have advantages of a fast response speed, safety, environmental friendliness and easy control of device materials, so that the light receiving device may be easily used for a power control, a microwave circuit or a communication module.

Therefore, the application of the semiconductor device is expanded to a transmitting module of an optical communication transmitting module, a light emitting diode backlight serving as a substitute for a cold cathode fluorescence lamp (CCFL) constituting a backlight of a liquid crystal display (LCD), a white light emitting diode lighting device serving as a substitute for a fluorescent lamp or an incandescent lamp, a vehicle headlight, a signal lamp and a sensor for detecting gas or fire. In addition, the application of the semiconductor device may be expanded to a high-frequency application circuit, other power control devices, and a communication module.

A light emitting device may serve as a p-n junction diode having a characteristic of converting electric energy into light energy by using group III-V or II-VI elements of the periodic table, and may provide various wavelengths by controlling the composition ratio of compound semiconductors.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, in the semiconductor device package, studies on a method for reducing the manufacturing cost and improving the manufacturing yield by improving the process efficiency and changing the structure have been performed.

SUMMARY OF THE INVENTION

An embodiment may provide a light emitting device package including a protruding portion to a frame facing each bonding portion of the light emitting device and/or an upper recess around the frame.

An embodiment provides a light emitting device package, a semiconductor device package, and a method of manufacturing the same, which provide a protruding portion of a frame facing each bonding portion of the light emitting device and may be disposed a conductive layer around a bottom of the protruding portion.

An embodiment provides a light emitting device package, a semiconductor device package, and a method of manufacturing the same, which provide a conductive layer around a protruding portion of a frame facing each bonding portion of the light emitting device and wherein the conductive layer may be covered with a resin.

An embodiment provides a light emitting device package, a semiconductor device package, a lighting module, and a method of manufacturing the same, which provide a flat portion of a frame facing each bonding portion of a semiconductor device and may be disposed different resins around the flat portion.

An embodiment provides a light emitting device package, a semiconductor device package, a lighting module, and a manufacturing method the same, which may be disposed resins having different reflection properties around a flat portion of a frame facing each bonding portion of a semiconductor device.

An embodiment provides a light emitting device package, a semiconductor device package, a lighting module, and a manufacturing method the same, which provides an upper recess around a flat portion of frames facing each bonding portion of a semiconductor device and may be disposed resin portions having different reflection properties in the upper recess.

An embodiment provides a light emitting device package, a semiconductor device package, and a method of manufacturing the same so that a protection device may be embedded in any one of resins disposed around a flat portion of a frame.

An embodiment may provide a semiconductor device package, a method of manufacturing a semiconductor device package, and a light source device capable of improving light extraction efficiency and electrical properties.

An embodiment may provide a semiconductor device package, a method of manufacturing a semiconductor device package, and a light source device capable of improving process efficiency and providing a new package structure to reduce manufacturing cost and improve manufacturing yield.

An embodiment may provide a semiconductor device package and a method of manufacturing a semiconductor device package that may prevent re-melting from occurring in a bonding region of the semiconductor device package while the semiconductor device package is re-bonded to a circuit board or the like.

The light emitting device package according to the embodiment may comprise: first and second frames spaced apart from each other; a body disposed between the first and second frames; a light emitting device including a first bonding portion and a second bonding portion on a lower portion thereof; and a first resin disposed between the body and the light emitting device, wherein the first frame includes a first protruding portion facing the first bonding portion of the light emitting device. And a second protruding portion facing the second bonding portion, and comprising a first conductive layer between the first bonding portion and the first protruding portion, and a second conductive layer between the second bonding portion and the second protruding portion.

According to the embodiments, the first and second protruding portions may have a flat surface in which an upper region facing the first and second bonding portions is a horizontal plane, and the first and second protruding portions may have an inclined side or a curved surface around the upper region.

According to an embodiment, a width of a first direction of the upper region in the first protruding portion may be smaller than a length of a second direction, and the first direction is a direction in which an imaginary line passing through a center of the first and second protruding portions extends. The second direction may be a direction orthogonal to the first direction.

According to an embodiment, a distance between the body and the upper regions of the first and second protruding portions may be equal to a width of the first direction of the upper regions of the first and second protruding portions.

According to an embodiment, the width of the first direction in the upper regions of the first and second protruding portions may be equal to a thickness of the first and second frames.

According to an embodiment, the first and second frames may have concave portions on opposite sides of the first and second protruding portions, and a heights of the first and second protruding portions may be equal to a depth of the concave portions.

According to an embodiment, a resin portion may be included on the body, the first and second frames, and the resin portion may contact the first and second conductive layers.

According to an embodiment, a first resin may be disposed between the body and the light emitting device, and the first resin may contact the first and second conductive layers.

According to an embodiment, at least one of the body and the first and second frames may include a recess or an opening.

According to an embodiment, an area of a lower surface of the first and second bonding portions may be larger than an area of an upper region of the first and second protruding portions.

According to an embodiment, a thickness of the first resin may be greater than a height of the first and second protruding portions.

According to an embodiment, the thickness of the first and second frames may range from 120 to 300 micrometers.

An light emitting device package according to the embodiment may comprise: first and second frames spaced apart from each other; a body disposed between the first and second frames, the body including a cavity having a bottom and a side surface; a light emitting device disposed in the cavity; a first resin between the light emitting device and the body; and a protection device disposed on the first frame, wherein a side surface of the cavity includes a first side portion spaced apart from the light emitting device and disposed around the light emitting device, a groove portion disposed around the first side portion, and the a second side portion disposed around the groove portion, wherein a bottom surface of the groove portion includes a first region in which a portion of the first frame is exposed, and the protection device is disposed in the first region, and the groove portion may include a second resin having a reflective material.

According to an embodiment, the light emitting device may include first and second bonding portions disposed on the first and second frames, and the first frame may include a first flat portion facing the first bonding portion and a first upper recess around the first flat portion, and the second frame may include a second flat portion facing the second bonding portion and a second upper recess around the second flat portion.

According to an embodiment, the first side portion may be continuously connected along the first and second upper recesses, and the second resin may be continuously connected to an outer periphery of the first side portion.

According to an embodiment, the first side portion may be continuously connected or discontinuously disposed along the first and second upper recesses. According to an embodiment, the second resin may have a reflectance higher than that of the first side portion.

According to an embodiment, the first frame may include first and second portions facing each other on both sides of the first upper recess, and the second frame include a third and fourth regions facing each other on both sides of the second upper recess. The protection device may disposed on any one of the first to fourth regions. According to an embodiment, the second resin may be disposed on the protection device.

According to an embodiment, the body may have a thickness of a region disposed between the first and second upper recesses thinner than a thickness of a region disposed between the first and second flat portions. According to an embodiment, the first side portion may be formed of the same material as the body. According to an embodiment, the upper surface of the first side portion may have a larger inclination angle than an inclination angle of the upper surface of the second resin.

According to an embodiment, a concave recess or/and a through hole is disposed in the body disposed between the first and second flat portions, and a first resin may be disposed in the recess or the through hole and may be in contact with the light emitting device.

According to an embodiment, a reflective portion may be included around the second resin, and the reflective portion may include a cavity that an upper portion is open, and the light emitting device may be disposed in the cavity. According to an embodiment, the reflective portion may be formed of the same material as the body and the first side portion, and a molding portion may be disposed in the cavity.

Lighting module according to the embodiment may include a circuit board; and the light emitting device package on the circuit board.

Advantageous Effects

According to the semiconductor device package and the semiconductor device package manufacturing method according to the embodiment, there is an advantage that may improve the light extraction efficiency, electrical properties and reliability.

According to the semiconductor device package and the semiconductor device package manufacturing method according to the embodiment, there is an advantage that may improve the process efficiency and reduce the manufacturing cost and improve the manufacturing yield by providing a new package structure.

A semiconductor device package according to the embodiment may provide a body having a high reflectance, thereby preventing the reflective portion from being discolored, thereby improving the reliability of the semiconductor device package.

According to the embodiment, the protection device disposed outside the light emitting device may be embedded in the resin, thereby reducing the light loss.

According to the embodiment, a white silicon may be separated from the light emitting device to reduce the light loss.

According to the semiconductor device package and the semiconductor device manufacturing method according to the embodiment, the re-melting phenomenon may be prevented from occurring in the bonding region of the semiconductor device package while the semiconductor device package is re-bonded to the circuit board, etc.

DETAILED DESCRIPTION

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it may be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package according to an embodiment of the invention will be described in detail with reference to the accompanying drawings. In the device package, the device may be a light emitting device that emits light of ultraviolet, infrared, or visible light, a non-light emitting device, a sensing device that senses wavelength or heat, or a protection device such as a Zener diode. Hereinafter, an example of a device is described as an example of a light emitting device, and may be defined as a package, a module, or a light source device to which the device is applied.

First Embodiment

Figure 1:
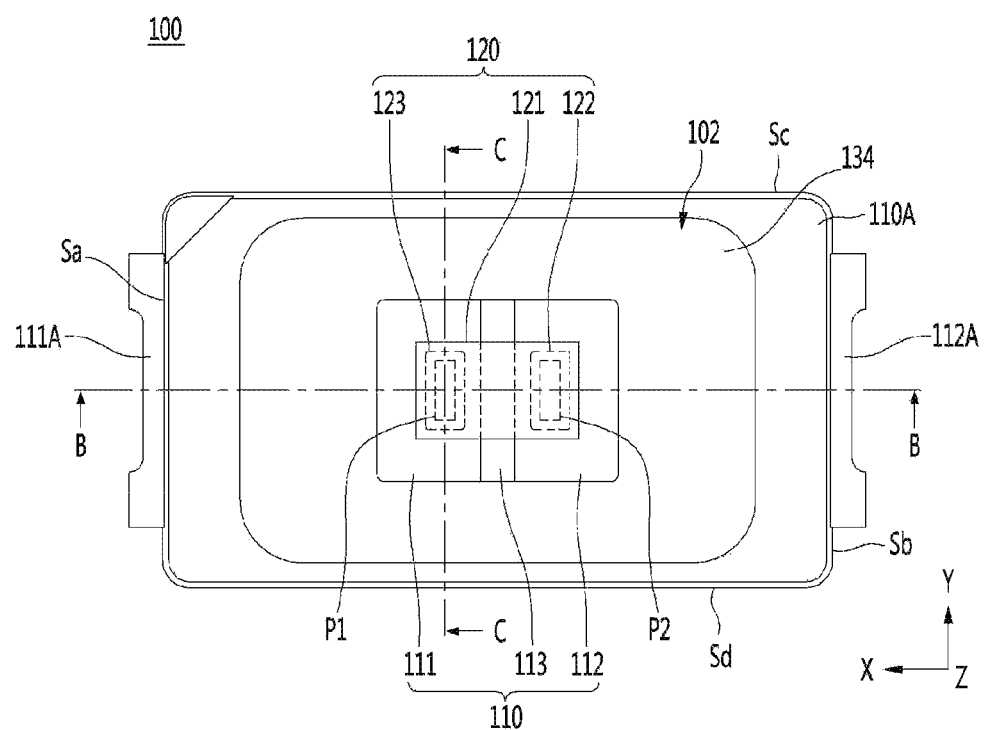
FIG. 1 is a plan view of a light emitting device package according to a first embodiment of the invention.
Figure 2:
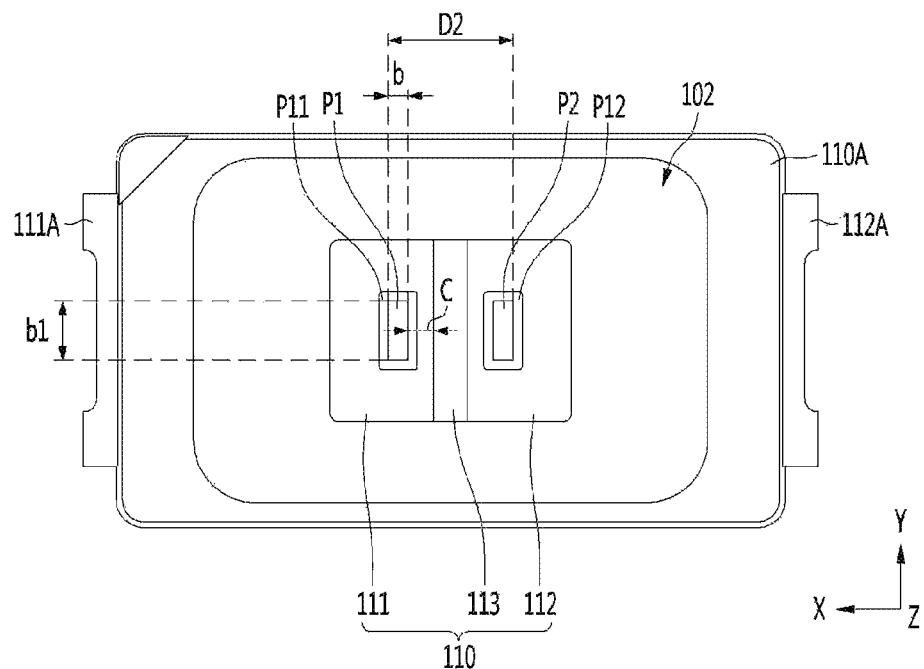
FIG. 2 is a front view of the light emitting device package of FIG. 1.
Figure 3:
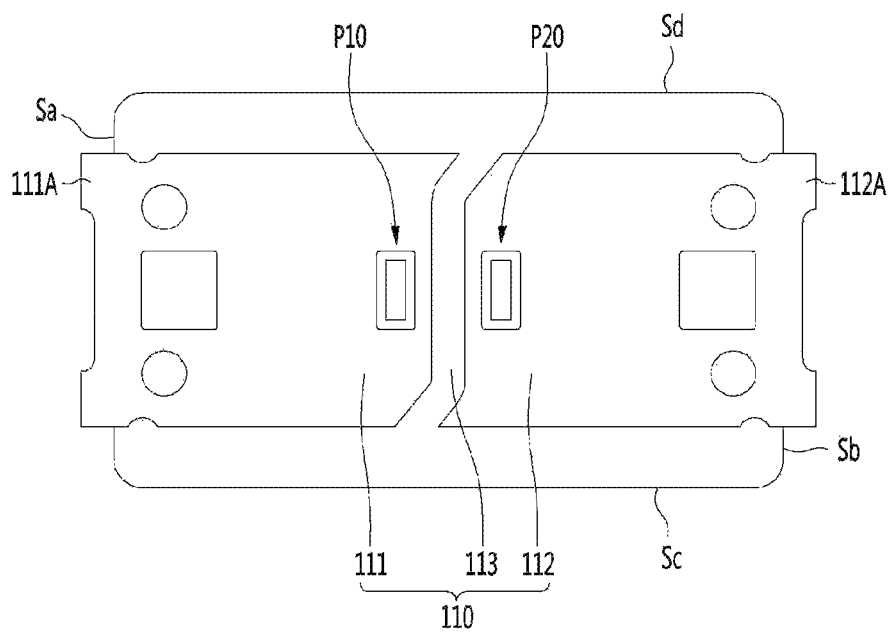
FIG. 3 is a bottom view of the light emitting device package of FIG. 1.
Figure 4:
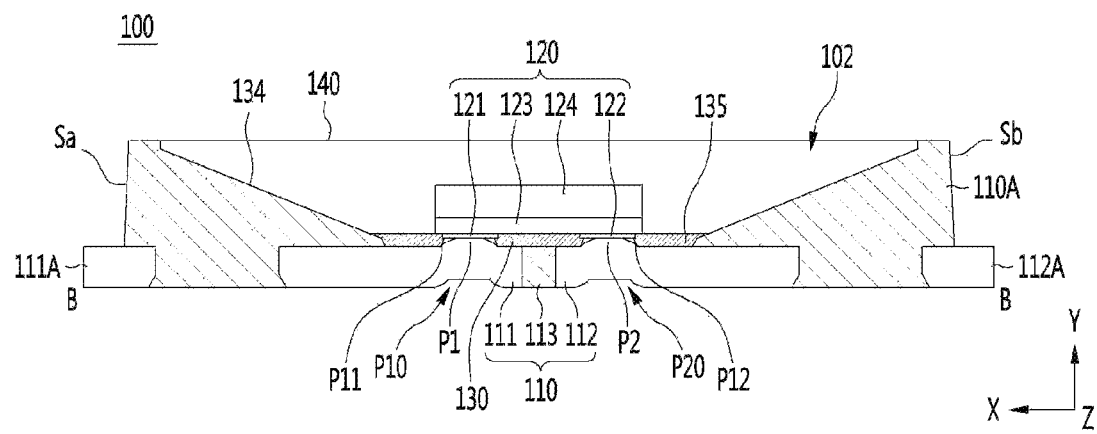
FIG. 4 is a cross-sectional view taken along line B-B of the light emitting device package shown in FIG. 1.
Figure 5:
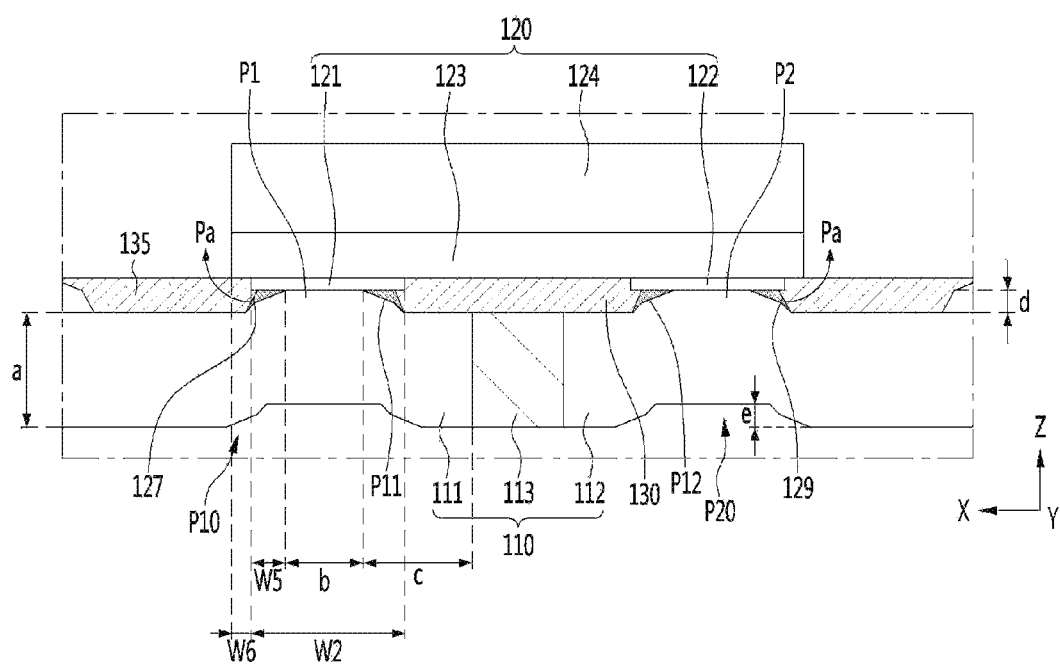
FIG. 5 is an enlarged view of a portion where the light emitting device of FIG. 4 is disposed.
Figure 6:
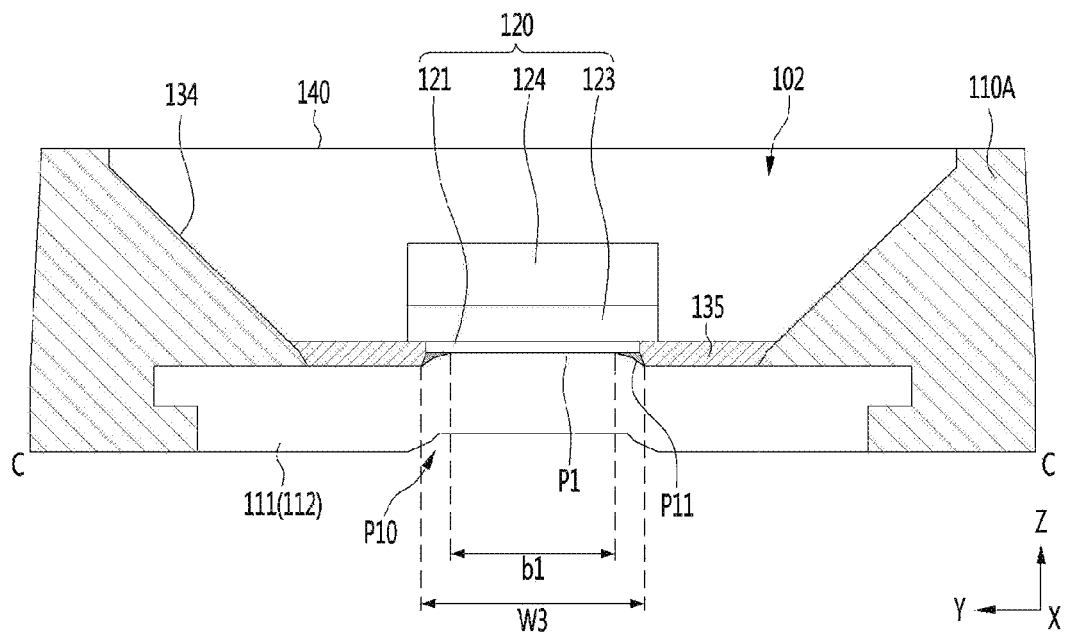
FIG. 6 is a cross-sectional view taken along the line C-C of the light emitting device package shown in FIG. 1.

A light emitting device package according to a first embodiment of the present invention will be described with reference to FIGS. 1 to 6. FIG. 1 is a plan view of a light emitting device package according to a first embodiment of the present invention, FIG. 2 is a front view of the light emitting device package of FIG. 1, FIG. 3 is a bottom view of the light emitting device package of FIG. 1, FIG. 4 is a cross-sectional view taken along line B-B of the light emitting device package shown in FIG. 1, FIG. 5 is an enlarged view of a portion where the light emitting device of FIG. 4 is disposed, and FIG. 6 is a cross-sectional view taken along the line C-C of the light emitting device package shown in FIG. 1.

Referring to FIGS. 1 to 6, the light emitting device package 100 according to the embodiment may include a package body 110 and a light emitting device 120.

The package body 110 may include a plurality of frames, for example, a first frame 111 and a second frame 112. The first frame 111 and the second frame 112 may be spaced apart from each other in the first direction X. The package body 110 may include a body 113. The body 113 may be disposed between the first frame 111 and the second frame 112. The body 113 may perform a function of a kind of electrode separation line. The body 113 may be referred to as an insulating member. The body 113 may be in contact with the first frame 111 and the second frame 112.

The body 113 may be disposed on the first frame 111. The body 113 may be disposed on the second frame 112. The body 113 may provide an inclined surface disposed on the first frame 111 and the second frame 112. A cavity 102 may be provided on the first frame 111 and the second frame 112 by the inclined surface of the body 113. According to an embodiment, the package body 110 may be provided in a structure having the cavity 102, or may be provided in a structure having a flat top surface without the cavity 102. The package body 110 may provide a reflective portion 110A having the cavity 102. The reflective portion 110A may cover the circumference of the cavity 102 and be coupled to the body 110.

The light emitting device package 100 may have a length in the first direction X equal to or greater than a length in the second direction Y. When the length of the first direction X is longer than the length of the second direction Y, the length of the first direction X in the package body 110 may have a length of 1.5 times or more than the length of the Y direction. The length of the Y direction may be in the range of 2 mm or more, for example, 2 mm to 4 mm. The first direction may be an X direction, the second direction may be a Y direction orthogonal to the X direction, and a third direction may be a height or thickness direction as a direction orthogonal to the X and Y directions.

Here, when the light emitting device 120 has a polygonal shape, the first direction may be a direction of a longer side of the sides of the light emitting device 120 or a direction in which the bonding portions are spaced apart from each other. For example, the first direction may be a long side direction of the light emitting device 120, and the second direction may be a short side direction. Alternatively, when the light emitting device 120 has a square shape, the lengths of the sides of the first direction and the second direction may be the same. Both short sides of the light emitting device 120 may be disposed opposite to each other in the first direction, and both long sides of the light emitting device 120 may be disposed opposite to each other in the second direction.

The package body 110 or the body 113 includes first and second side surfaces Sa and Sb disposed in the first direction, and third and fourth side surfaces Sc and Sd disposed in the second direction. The first and second side surfaces Sa and Sb may face each other with respect to the first direction of the package body 110. The third and fourth side surfaces Sc and Sd may face each other with respect to the second direction of the package body 110. An interval between the first and second side surfaces Sa and Sb may be a length in the first direction of the third and fourth side surfaces Sc and Sd. An interval between the third and fourth side surfaces Sc and Sd may be a length in the second direction of the first and second side surfaces Sa and Sb. Each side surface Sa, Sb, Sc, and Sd of the package body 110 may be a vertical surface or an inclined surface. Each side surface Sa, Sb, Sc, and Sd of the package body 110 may be each side surface of the reflective portion 110A.

For example, the body 113 may be made of at least one selected from the group consisting of Polyphthalamide (PPA), Polychloro triphenyl (PCT), liquid crystal polymer (LCP), polyamide 9T (PA9T), silicon, epoxy molding compound (EMC), silicon molding compound (SMC), ceramic, photo sensitive glass (PSG), sapphire (Al2O3) and the like. The body 113 may include high refractive fillers such as TiO2 and SiO2. The reflective portion 110A may be made of the same material as the body 113. As another example, the reflective portion 110A may be made of a material different from that of the body 113.

The body 113 may include the cavity 102. The cavity 102 may include a bottom surface and a side surface, and the side surface of the cavity 102 may be disposed around the bottom surface of the cavity 102. The light emitting device 120 may be disposed on the bottom surface of the cavity 102.

The first frame 111 and the second frame 112 may be provided as a conductive frame. The first frame 111 and the second frame 112 may stably provide structural strength of the package body 110, and may be electrically connected to the light emitting device 120. A first extension portion 111A of the first frame 111 may extend in the first side direction of the package body 110 and may protrude toward the first side surface Sa. A second extension portion 112A of the second frame 112 may extend in the second side direction of the package body 110 and may protrude to the second side surface Sb. The first and second side surfaces Sa and Sb of the package body 110 may be opposite to each other. As another example, the first frame 111 and the second frame 112 may be provided as an insulating frame. The first frame 111 and the second frame 112 may stably provide structural strength of the package body 110.

In example embodiments, the light emitting device 120 may include a first bonding portion 121, a second bonding portion 122, and a semiconductor layer 123. The light emitting device 120 may include a substrate 124. The light emitting device 120 may have a length in the first direction longer than a length in the second direction. The first direction may be a direction in which the first bonding portion 121 and the second bonding portion 122 overlap each other.

The semiconductor layer 123 may include a first conductive semiconductor layer, a second conductive semiconductor layer, and an active layer disposed between the first conductive semiconductor layer and the second conductive semiconductor layer. The first bonding portion 121 may be electrically connected to the first conductive semiconductor layer. In addition, the second bonding portion 122 may be electrically connected to the second conductive semiconductor layer.

The substrate 124 may include a light transmitting layer, and may be formed of an insulating material or a semiconductor material. The substrate 124 may be selected from a group including, for example, sapphire substrate (Al2O3), SiC, GaAs, GaN, ZnO, Si, GaP, InP, and Ge. For example, an uneven pattern may be formed on a surface of the substrate 124.

According to an embodiment, the semiconductor layer 123 may be provided as a compound semiconductor. The semiconductor layer 123 may be provided as a group II-VI or group III-V compound semiconductor. For example, the semiconductor layer 123 may include at least two elements selected from aluminum (Al), gallium (Ga), indium (In), phosphorus (P), arsenic (As), and nitrogen (N).

The semiconductor layer 123 may include a first conductive semiconductor layer, an active layer, and a second conductive semiconductor layer. The first and second conductive semiconductor layers may be implemented as at least one of a compound semiconductor of Group II-VI or Group III-V. The first and second conductive semiconductor layers may be formed of, for example, a semiconductor material having a composition formula of $In_xAl_yGa_{1-x-y}N$ ($0 \leq x \leq 1$, $0 \leq y \leq 1$, $0 \leq x+y \leq 1$). For example, the first and second conductive semiconductor layers may include at least one selected from the group consisting of GaN, AlN, AlGaN, InGaN, InN, InAlGaN, AlInN, AlGaAs, GaP, GaAs, GaAsP, and AlGaInP. The first conductive semiconductor layer may be an n-type semiconductor layer doped with n-type dopants of Si, Ge, Sn, Se, and Te. The second conductive semiconductor layer may be a p-type semiconductor layer doped with p-type dopants of Mg, Zn, Ca, Sr, and Ba.

The active layer may be implemented with a compound semiconductor. The active layer may be implemented as at least one of a compound semiconductor of Group II-VI or Group III-V. When the active layer is implemented as a multi-well structure, the active layer may include a plurality of well layers and a plurality of barrier layers that are alternately arranged, and may disposed of a semiconductor material having a composition formula of $In_xAl_yGa_{1-x-y}N$ ($0 \leq x \leq 1$, $0 \leq y \leq 1$, $0 \leq x+y \leq 1$). For example, the active layer may include at least one selected from the group comprising InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

The light emitting device 120 may be disposed on the package body 110. The light emitting device 120 may be disposed on the first frame 111 and the second frame 112. The light emitting device 120 may be disposed on the body 113. The light emitting device 120 may overlap the body 113 in a vertical direction. The light emitting device 120 may be disposed in the cavity 102 provided by the package body 110. The cavity 102 may be formed by the reflective portion 110A of the package body 110.

The first bonding portion 121 and the second bonding portion 122 may be spaced apart from each other on the lower surface of the light emitting device 120. The first bonding portion 121 may be disposed on the first frame 111. The second bonding portion 122 may be disposed on the second frame 112. The first and second bonding portions 121 and 122 may be electrodes or pads.

The first bonding portion 121 may be disposed between the semiconductor layer 123 and the first frame 111. The second bonding portion 122 may be disposed between the semiconductor layer 123 and the second frame 112. The first bonding portion 121 and the second bonding portion 122 may be formed in a single layer or multiple layers using one or more materials or alloys of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO.

The first bonding portion 121 may overlap the first frame 111 in the vertical direction. The first bonding portion 121 may be electrically connected to the first frame 111. The second bonding portion 122 may overlap the second frame 112 in the vertical direction. The first bonding portion 121 may be electrically connected to the second frame 112.

Referring to FIGS. 1 to 3, the light emitting device package 100 according to the embodiment may include a first protruding portion P1 and a second protruding portion P2. The first frame 111 may include the first protruding portion P1. The second frame 112 may include the second protruding portion P2. The first protruding portion P1 and the second protruding portion P2 may protrude from the bottom surface of the cavity 102 toward a direction of the upper surface of the reflective portion 110A or the upper direction of the cavity 102.

The light emitting device package 100 according to the embodiment is electrically connected to the first bonding portion 121 through the first protruding portion P1, and is electrically connected to the second bonding portion 122 through the second protruding portion P2. Accordingly, the light emitting device 120 may be driven by driving power supplied through the first bonding portion 121 and the second bonding portion 122. In addition, the light emitted from the light emitting device 120 may be provided in an upper direction of the package body 110.

The first protruding portion P1 may be disposed in the first frame 111. The first protruding portion P1 may protrude from the first frame 111. The first protruding portion P1 may have a structure in which a portion of the upper surface of the first frame 111 protrudes. The first protruding portion P1 may be a region in which a part of the first frame 111 protrudes in the vertical direction. The first protruding portion P1 may protrude from the upper and lower surfaces of the first frame 111 in the vertical direction Z. The first protruding portion P1 may be formed of the same material as the first frame 111. A region corresponding to the first protruding portion P1 among the lower portions of the first frame 111 may include a first concave portion P10. The protruding height d of the first protruding portion P1 may be equal to a depth e of the first concave portion P10.

Referring to FIGS. 2, 5 and 6, the first protruding portion P1 may have a greater length b1 (b1>b) in the second direction Y than a width b of the first direction X. The first direction may be a horizontal direction, a long side direction of the package body 110, or a direction in which the two frames 111 and 112 are spaced apart from each other. The second direction may be a longitudinal direction, a short side direction of the package body 110, or a direction in which the body 113 between the two frames 111 and 112 extends.

The second protruding portion P2 may have a greater length b1 (b1>b) in the second direction Y than a width b of the first direction X. The first direction may be a horizontal direction, a long side direction of the package body 110, or a direction in which the two frames 111 and 112 are spaced apart from each other. The first direction may be a direction in which virtual lines connecting the centers of the first and second protruding portions P1 and P2 extend.

The first protruding portion P1 may be disposed under the first bonding portion 121 of the light emitting device 120. The first protruding portion P1 may overlap the first bonding portion 121 of the light emitting device 120 in a third direction. The first protruding portion P1 may overlap the first bonding portion 121 of the light emitting device 120 in a third direction from the upper surface of the first frame 111 to the lower surface.

Referring to FIGS. 2 and 3, the second protruding portion P2 may be disposed in the second frame 112. The second protruding portion P2 may protrude from the second frame 112. The second protruding portion P2 may have a structure in which a portion of the upper surface of the second frame 112 protrudes. The second protruding portion P2 may be a region in which a part of the second frame 112 protrudes in the vertical direction. The second protruding portion P2 may protrude from the upper and bottom surfaces of the second frame 112 in the third direction. The second protruding portion P2 may be formed of the same material as the second frame 112. A region corresponding to the second protruding portion P2 among the lower portions of the second frame 112 may include a second concave portion P20. The protruding height of the second protruding portion P2 may be equal to a depth e of the second concave portion P20.

The first concave portion P10 may be a region overlapping with the first protruding portion P1 in a vertical direction of the flat lower surface of the first frame 111. The second concave portion P20 may be an area overlapping the second convex portion P2 in the vertical direction of the flat lower surface of the second frame 112.

The first and second concave portions P10 and P20 are concave in the third direction from the lower surfaces of the first and second frames 111 and 112 toward the upper surfaces of the first and second frames 111 and 112. The first and second concave portions P10 and P20 may overlap the protruding portions 111 and 112 in the third direction, and may have the same depth as the height of the first and second protruding portions 111.

A first conductive layer 127 may be disposed between the first frame 111 and the first bonding portion 121 of the light emitting device 120. A second conductive layer 129 may be disposed between the second frame 112 and the second bonding portion 122 of the light emitting device 120. The first conductive layer 127 may be bonded between the first protruding portion P1 of the first frame 111 and the first bonding portion 121. The second conductive layer 129 may be bonded between the second protruding portion P2 and the second bonding portion 122 of the second frame 112. The first conductive layer 127 may overlap the first protruding portion P1 and the first bonding portion 121 of the first frame 111 in the vertical direction. The second conductive layer 129 may overlap the second protruding portion P2 and the second bonding portion 122 of the second frame 112 in the vertical direction.

The first and second conductive layers 127 and 129 may be bonded to the first and second bonding portions 121 and 122 in the upper regions of the first and second protruding portions P1 and P2. A portion of the first and second conductive layers 127 and 129 may be disposed around a lower portion of the first and second protruding portions P1 and P2.

The first and second conductive layers 127 and 129 may include one material or alloy selected from the group consisting of Ag, Au, Pt, Sn, Cu, or an alloy thereof. At least one of the protruding portions P1 and P2 and the bonding portions 121 and 122 of each of the frames 111 and 112 may be formed by combining a material constituting formed therein with the materials of the first and second conductive layers 127 and 129 to be compounded by an intermetallic compound layer. The intermetallic compound may include at least one of $Cu_xSn_y$, $Ag_xSn_y$, and $Au_xSn_y$, and may satisfy a condition of $0<x<1$, $y=1-x$, and $x>y$.

The intermetallic compound (IMC) layer may be formed between the bonding portions 121 and 122 of the light emitting device 120, the conductive layers 127 and 129 and the frames 111 and 112 by form of a material constituting the conductive layers 127 and 129 and the conductive layers 127 and 129, or a heat treatment process after the conductive layers 127 and 129 are provided. For example, the conductive layers 127 and 129 may be formed using a conductive paste. The conductive paste may include a solder paste, a silver paste, or the like, and may include a multilayer composed of different materials, or a single layer or multilayer composed of an alloy. For example, the conductive layers 127 and 129 may include an SAC (Sn—Ag—Cu) material.

For example, an alloy layer may be formed by bonding between a material constituting the conductive layers 127 and 129 and a metal of the frames 111 and 112. Accordingly, the conductive layers 127 and 129 and the frames 111 and 112 may be physically and electrically coupled to each other stably. The conductive layers 127 and 129, the alloy layer and the frame may be physically and electrically stably combined. The alloy layer may include at least one intermetallic compound layer selected from the group including AgSn, CuSn, AuSn, and the like. The intermetallic compound layer may be formed by combining a first material and a second material, the first material may be provided from the conductive layers 127 and 129, and the second material may be provided from the bonding portions 121 and 122 or the frames 111 and 112.

The light emitting device package 100 may be mounted on a sub-mount or a circuit board. However, in the conventional light emitting device package is mounted on the sub-mount or the circuit board, a high temperature process such as a reflow may be applied. At this time, in the reflow process, a re-melting phenomenon occurs in the bonding region between the lead frame and the light emitting device provided in the light emitting device package, thereby weakening the stability of the electrical connection and the physical coupling.

The first bonding portion 121 and the second bonding portion 122 of the light emitting device according to the embodiment may receive driving power through the protruding portions P1 and P2 and the conductive layers 127 and 129. In addition, the melting points of the conductive layers 127 and 129 may be selected to have a higher value than the melting points of other bonding materials. Therefore, when the light emitting device package 100 according to the embodiment is bonded through a reflow process to a main substrate, a re-melting phenomenon may not occur. Accordingly, there is an advantage that the electrical connection and the physical bonding force in the bonding portion do not deteriorate. In addition, according to the light emitting device package 100 according to the embodiment, the package body 110 does not need to be exposed to high temperatures in the process of manufacturing the light emitting device package. Therefore, according to the embodiment, the package body 110 may be prevented from being damaged or discolored due to exposure to high temperature. Accordingly, a selection range for the material constituting the body 113 may be widened. According to an embodiment, the body 113 may be provided using a relatively inexpensive resin material as well as an expensive material such as a ceramic. For example, the body 113 may include at least one material selected from the group consisting of a Polyphthalamide (PPA) resin, a Polycyclohexylenedimethylene terephthalate (PCT) resin, an epoxy molding compound (EMC) resin, and a silicone molding compound (SMC) resin.

The light emitting device package 100 according to the embodiment may include a first resin 130. The first resin 130 may be disposed between the body 113 and the light emitting device 120. The first resin 130 may be disposed between the upper surface of the body 113 and the lower surface of the light emitting device 120. The first resin 130 may be disposed between the first bonding portion 121 and the second bonding portion 122. The first resin 130 may be disposed between the first protruding portion P1 and the second protruding portion P2. For example, the first resin 130 is in contact with the side of the first bonding portion 121 and the side of the second bonding portion 122 and may face or contact an inside of the first protruding portion P1 and the second protruding portion P2. A thickness of the first resin 130 may be greater than the height d or the thickness of the protruding portions P1 and P2. The first resin 130 may be in contact with the light emitting device 120.

The first resin 130 may provide a stable fixing force between the light emitting device 120 and the package body 110. The first resin 130 may be an adhesive. The first resin 130 may provide a stable fixing force between the light emitting device 120 and the body 113. The first resin 130 may be disposed in direct contact with the upper surface of the body 113. The first resin 130 may directly contact the lower surface of the light emitting device 120. For example, the first resin 130 may include at least one of an epoxy material, a silicon material, a hybrid material including an epoxy material and a silicon material. Also, as an example, when the first resin 130 includes a reflective function, the first resin 130 may include white silicone. The material of the first resin 130 may be formed of a material that radiates heat generated from the light emitting device 120.

When light is emitted to the bottom surface of the light emitting device 120, the first resin 130 may provide a light diffusion function between the light emitting device 120 and the body 113. Since the first resin 130 provides a light diffusing function, light extraction efficiency of the light emitting device package 100 may be improved. In addition, the first resin 130 may reflect light emitted from the light emitting device 120. When the first resin 130 includes a reflection function, the first resin 130 may be formed of a material including TiO2, Silicone, or the like.

Referring to FIGS. 4 to 6, the light emitting device package 100 according to the embodiment may include a second resin 135. For reference, in FIG. 1, the second resin 135 and the molding portion 140 is not shown to be arranged so that the arrangement relationship between the first frame 111, the second frame 112, and the body 113 may be well represented.

The second resin 135 may be disposed between the first frame 111 and the lower portion of the light emitting device 120. The second resin 135 may be disposed between the second frame 112 and the lower portion of the light emitting device 120. The second resin 135 may be provided on the bottom surface of the cavity 102 provided in the package body 110. The second resin 135 may be disposed on side surfaces of the first bonding portion 121 and the second bonding portion 122. The second resin 135 may be in contact with the bottom surface of the light emitting device 120. The thickness of the second resin 135 may be greater than the height d or the thickness of the protruding portions P1 and P2. The second resin 135 may be in contact with the light emitting device 120.

The second resin 135 may be disposed around the lower portion of the light emitting device 120. The second resin 135 may be connected to or adhered to the first resin 130. A portion of the upper surface of the second resin 135 may be lower than the lower surface of the light emitting device 120. The thickness of the second resin 135 may be equal to or smaller than a distance (E.g. d) between the lower surface of the light emitting device 120 and the upper surfaces of the frames 111 and 112. The second resin 135 may surround or contact the outside of the bonding portions 121 and 122. The second resin 135 may surround or contact the outside of the protruding portions P1 and P2.

The first resin 130 and the second resin 135 may contact the outside of the conductive layers 127 and 129 disposed on the side surfaces P11 and P12 of the protruding portions P1 and P2. The second resin 135 may surround or contact the outside of the conductive layers 127 and 129. The second resin 135 and the first resin 130 may seal the surfaces of the conductive layers 127 and 129 and contact the lower surface of the light emitting device 120. Accordingly, the second resin 135 and the first resin 130 may protect the light emitting device 120 from the conductive layers 127 and 129.

For example, the second resin 135 may include at least one of an epoxy-based material, a silicon-based material, a hybrid material including an epoxy-based material and a silicon-based material. The second resin 135 may be a reflective portion that reflects light emitted from the light emitting device 120. For example, the second resin 135 may be a resin including a reflective material such as TiO2 or may include white silicone.

The second resin 135 may be disposed under the light emitting device 120 to perform a sealing function. The second resin 135 may improve the adhesion between the light emitting device 120 and the first frame 111. The second resin 135 may improve the adhesion between the light emitting device 120 and the second frame 112.

When the second resin 135 includes a material having a reflective property such as white silicon, the second resin 135 may reflect light provided from the light emitting device 120 to the upper direction of the package body 110 and the light extraction efficiency of the light emitting device package 100 may be improved. The second resin 135 and the first resin 130 may be formed of the same material.

Referring to FIG. 4, the molding portion 140 may be disposed on the light emitting device 120. The molding portion 140 may be disposed on the first frame 111 and the second frame 112. The molding portion 140 may be disposed in the cavity 102 provided by the reflective portion 110A of the package body 110. The molding portion 140 may be disposed on the second resin 135. The molding portion 140 may be in contact with an upper surface of the second resin 135, an upper surface and a side surface of the light emitting device 120, and a part of the side surface of the cavity 102. The side surface of the cavity 102 may include a lower first side portion and an upper second side portion 134, and the lower first side portion may contact the second resin 135. The second side portion 134 may be disposed above the first side portion and may contact the molding portion 140.

The molding portion 140 may include an insulating material. The molding portion 140 may include a transparent material. The molding portion 140 may include wavelength conversion means for receiving the light emitted from the light emitting device 120 and providing the wavelength-converted light. The wavelength converting means is a material added in the molding portion 140 and may include a phosphor or a quantum dot. For example, the molding portion 140 may be at least one of a group including a phosphor or a quantum dot. The molding portion 140 may be formed as a single layer or a multilayer, and in the case of a multilayer, any one layer may be free of impurities such as phosphors, and the other layer may have impurities such as phosphors.

The upper surface of the molding portion 140 may be concave or convex. The upper surface of the molding portion 140 may be a flat, curved or rough surface.

In the light emitting device package 100 according to the embodiment, power is connected to the first bonding portion 121 through the first protruding portion P1, and is connected to the second bonding portion 122 through the second protruding portion P2.

Accordingly, the light emitting device 120 may be driven by driving power supplied through the first bonding portion 121 and the second bonding portion 122. In addition, the light emitted from the light emitting device 120 may be provided in an upper direction of the package body 110.

On the other hand, according to another example of the light emitting device package according to an embodiment of the invention, the second resin 135 is not provided separately, the molding portion 140 may be arranged in direct contact the first frame 111 and the second frame 112.

Referring to FIG. 5, the height d of the protruding portions P1 and P2 in the frames 111 and 1112 may be smaller than the thickness a of the frames 111 and 112. For example, the height d may be in the range of 25% or more, for example, 25% to 75% of the thickness a. The height d of the first and second protruding portions P1 and P2 may protrude from the upper surfaces of the frames 111 and 112 in a range of 50 micrometers or more, for example, 50 to 100 micrometers. If the protruding height d of the first and second protruding portions P1 and P2 is smaller than the range, the protruding height is lowered, which may cause a problem that the conductive paste may ride up to the side of the light emitting device 120. When the protruding height d of the first and second protruding portions P1 and P2 exceeds the range, a hardness of the frames 111 and 112 may be reduced. The thickness a of the frames 111 and 112 may be 120 micrometers or more, for example, in a range of 120 to 300 micrometers or in a range of 200 to 270 micrometers.

When the height d of the protruding portions P1 and P2 is smaller than the range, the thickness of the second resin 135 disposed around the lower portion of the light emitting device 120 becomes thinner than 50 micrometers, and there is a problem that the function as the reflective resin is reduced. Accordingly, when the height d of the protruding portions P1 and P2 is formed in the above range, it is possible to ensure the thickness of the second resin 135 and may be provided as a white resin to prevent the decrease in light reflection efficiency.

The second protruding portion P2 may be disposed under the second bonding portion 122 of the light emitting device 120. The second protruding portion P2 may overlap the second bonding portion 122 of the light emitting device 120 in the third direction. The second protruding portion P2 may be provided to overlap the second bonding portion 122 of the light emitting device 120 in the third direction from a top surface of the second frame 112 to a bottom surface thereof.

The first protruding portion P1 and the second protruding portion P2 may be spaced apart from each other. The first protruding portion P1 and the second protruding portion P2 may be spaced apart from each other under the lower surface of the light emitting device 120.

Here, the first and second protruding portions P1 and P2 may include flat surfaces in an upper region thereof, and side surfaces P11 and P12 around the first and second protruding portions P1 and P2 may be disposed in an inclined surfaces or curved surfaces. An area of the entire region protruding from the first protruding portion P1 may be equal to or smaller than an area of the lower surface of the first bonding portion 121. The area of the entire region protruding from the second protruding portion P2 may be equal to or smaller than the area of the lower surface of the second bonding portion 122. The area of the horizontal upper region in the first and second protruding portions P1 and P2 may be larger than an area of the inclined side surfaces P11 and P12, and the contact area of the bonding portion may be increased.

The upper regions of the first and second protruding portions P1 and P2 may face the first and second bonding portions 121 and 121. The outer regions or the side surfaces P11 and P12 of the first and second protruding portions P1 and P2 may be spaced apart from the lower surfaces of the first and second bonding portions 121 and 122. An area of a horizontal plane of the upper regions in the first and second protruding portions P1 and P2 may be smaller than an area of the lower surface of each of the bonding portions 121 and 122.

As shown in FIG. 5, a width b in the upper region of the first protruding portion P1 in the first direction may be smaller than or equal to a width W2 of the first bonding portion 121. A width of the upper region of the second protruding portion P2 in the first direction may be smaller than or equal to a width of the second bonding portion 122. The width W2 of the first bonding portion 121 is 20% or more than the width of the first direction of the light emitting device 120 and may be, for example, in a range of 20% to 40%. The areas of the upper regions of the first and second protruding portions P1 and P2 may prevent the areas corresponding to the first and second bonding portions 121 and 122 from being reduced.

As shown in FIG. 6, the length b1 of the upper region of the first protruding portion P1 in the second direction Y may be smaller than a length W3 of the first bonding portion 121. The length W3 of the first bonding portion 121 is 70% or more than the length of the first light emitting device 120 in the second direction, and may be, for example, in a range of 70% to 95%.

The width b of the first direction X in the upper regions of the first and second protruding portions P1 and P2 may be 50% or more, for example, 50% to 90% of the width W2 of the bonding portions 121 and 122. It may be a range. When the width b is within the above range, reliability of thermal conductivity and electrical conductivity may be improved by bonding the first and second protruding portions P1 and P2 to the bonding portions 121 and 122. The width b may be in the range of 200 micrometers or more, for example 200 to 300 micrometers. The holding force (e.g. DST) of the light emitting device 110 having the bonding portions 121 and 122 may be increased.

The first bonding portion 121 of the light emitting device 120 and the first protruding portion P1 of the first frame 111 may be connected by the first conductive layer 127. The second bonding portion 122 and the second protruding portion P2 of the second frame 112 may be connected by the second conductive layer 129. When the first and second bonding portions 121 and 122 are bonded to the first and second protruding portions P1 and P2, the first and second conductive layers 127 and 129 are disposed on a flat portion of P2 and a portion of the first and second conductive layers 127 and 129 flows to the side surfaces P11 and P12 located in a low region thereof. Accordingly, the first and second conductive layers 127 and 129 may be disposed on side surfaces P11 and P12 of the first and second protruding portions P1 and P2 and may be further spaced apart from the bottom surface of the light emitting device 120. Accordingly, when the first and second conductive layers 127 and 129 are bonded in the bonding process of the light emitting device 120, a portion of the first and second conductive layers 127 and 129 may be moved downward and may be prevented from a movement along the side surfaces of the light emitting device 120 (Pa in FIG. 5). Therefore, the problem of absorbing the light emitted through the side surface of the light emitting device 120 by the first and second conductive layers 127 and 129 or giving a short circuit to the semiconductor layer may be solved.

The first and second frames 111 and 112 may be more firmly attached to the first and second bonding portions 121 and 122 of the light emitting device 120 by the first and second conductive layers 127 and 129.

The distance W5 from the edges of the upper regions of the first and second protruding portions P1 and P2 to the ends of the first and second bonding portions 121 and 122 may be provided between 40 and 60 micrometers. When the distance W5 is 40 micrometers or more, the first and second bonding portions 121 and 122 may secure a process margin for contacting the upper surfaces of the first and second protruding portions P1 and P2. In the manufacturing process, the conductive paste which is the conductive layers 127 and 129 may not fall in the down direction. When the distance W5 is 60 micrometers or less, an area of the first and second bonding portions 121 and 122 exposed to the first and second protruding portions P1 and P2 may be secured, and the first and second bonding portions 121 and 122 and the second resin 135 may contact each other to improve reliability.

The distance W6 between the first and second bonding portions 121 and 122 and the side surface of the light emitting device 120 may be disposed in a range of 60 micrometers or more, for example, 60 to 90 micrometers. If the distance W6 is not secured, the distance between the conductive layers 127 and 129 is difficult to be secured, which may cause a problem due to the conductive paste. That is, when the distance (W5+W6) between the side surfaces of the light emitting device 120 from the flat surfaces of the first and second bonding portions 121 and 122 is spaced in the range of at least 100 micrometers, a periphery of the protruding portions P1 and P2 may be secured a safety distance by the conductive layers 127 and 129.

The width b and the length b1 of the upper region of the first protruding portion P1 may be smaller than the width and the length of the lower region of the first protruding portion P1. The width and length of the upper region of the second protruding portion P2 may be smaller than the width and length of the lower region of the second protruding portion P2. When the width and length of the upper regions of the first and second protruding portions P1 and P2 are greater than the width and length of the lower regions of the first and second protruding portions P1 and P2, the hardness of the protruding portion is lowered, a thickness of the inclined part of the protruding portion may be thin, or it is difficult to an injection molding.

The first and second protruding portions P1 and P2 may be provided in an inclined form by gradually decreasing in width from the lower region to the upper region by side surfaces P11 and P12. A top view shape of the first and second protruding portions P1 and P2 may have a polygonal shape, an ellipse shape, or a circular shape. Side cross-sectional shapes of the first and second protruding portions P1 and P2 may be polygonal, hemispherical or semi-elliptic. The side surfaces P11 and P12 may have a plurality of inclined surfaces having different inclinations or may be arranged as curved surfaces having different curvatures.

The interval between the first protruding portion P1 and the second protruding portion P2 in the lower region of the first frame 111 and the second frame 112 may be provided as 100 micrometers or more, for example, 100 to 150 micrometers.

In the lower region of the first frame 111 and the second frame 112, the distance between the first protruding portion P1 and the second protruding portion P2 is determined by the light emitting device package 100 according to an embodiment. When the light emitting device package 100 is mounted on the circuit board, sub-mount, or the like, the distance may be selected to be provided over a certain distance to prevent electrical short between pads.

Referring to FIGS. 2 and 5, when the protruding portions P1 and P2 are disposed adjacent to the body 113, the frames 111 and 112 may be rolled or wound in the side direction of the body by the protruding portions P1 and P2, which may lower the reliability of the package. Accordingly, the distance c between the edges of the protruding portions P1 and P2 and the body 113 may be 120 micrometers or more, for example, in the range of 120 to 300 micrometers or in the range of 200 to 270 micrometers. A ratio c:d between the distance c and the thickness d of the frames 111 and 112 may range from 0.8:1 to 1:0.8. For example, the distance c and the thickness d may be the same and may be a ratio (c:d) of 1:1. The ratio b:a of the width b of the upper regions of the protruding portions P1 and P2 and the thickness a of the frames 111 and 112 may be 0.8:1 to 1:0.8. Alternatively, the width b and the thickness a may be the same and may be a ratio (b:a) of 1:1. The ratio b:c of the width b of the upper regions of the protruding portions P1 and P2 and the distance c between the body 113 and the protrusion portions may be 0.8:1 to 1:0.8, or 1:1. In this ratio, the width b of the upper region of the protruding portions P1 and P2 and the distance c between the protruding portions P1 and P2 and the body based on the thickness a of the frames 111 and 112 may be 80% to 120%. Therefore, when the width b of the upper regions of the protruding portions P1 and P2, the distance c from the body 113, and the thickness a of the frames 111 and 112, a ratio b:c:d may include 1:1:1. According to the embodiment, when the protruding portions P1 and P2 are formed in the frames 111 and 112, the problems in which the frames 111 and 112 are rolled or wound by the protruding portions P1 and P2 may be prevented, and a flat areas of the bonding portions 121 and 122 and the protruding portions P1 and P2 may be provided in a range in which thermal conductivity and electrical conductivity are not degraded.

The protruding portions P1 and P2 of the frames 111 and 112 according to the embodiment have side surfaces P11 and P12 inclined to the outside and overlap the light emitting device 120 in the vertical direction, and may be disposed in the regions of the bonding portions 121 and 122. As a result, when the conductive layers 127 and 129 are formed, the paste of the conductive layers 127 and 129 may rise to the side of the light emitting device 120. In addition, since the conductive layers 127 and 129 are spaced apart from the side surface of the light emitting device 120 and the second resin 135 extends to the bottom of the light emitting device 120, and a light reflection efficiency on the lower portion and the outside of the light emitting device 120 may be improved.

In addition, since a process without a separate half etching is removed on the upper portions of the frames 111 and 112, the process may be simplified and the protruding portions may be provided by a frame mold, thereby lowering the frame cost and the price of the package. Therefore, the reliability of the light emitting device package may be improved.

Figure 7:
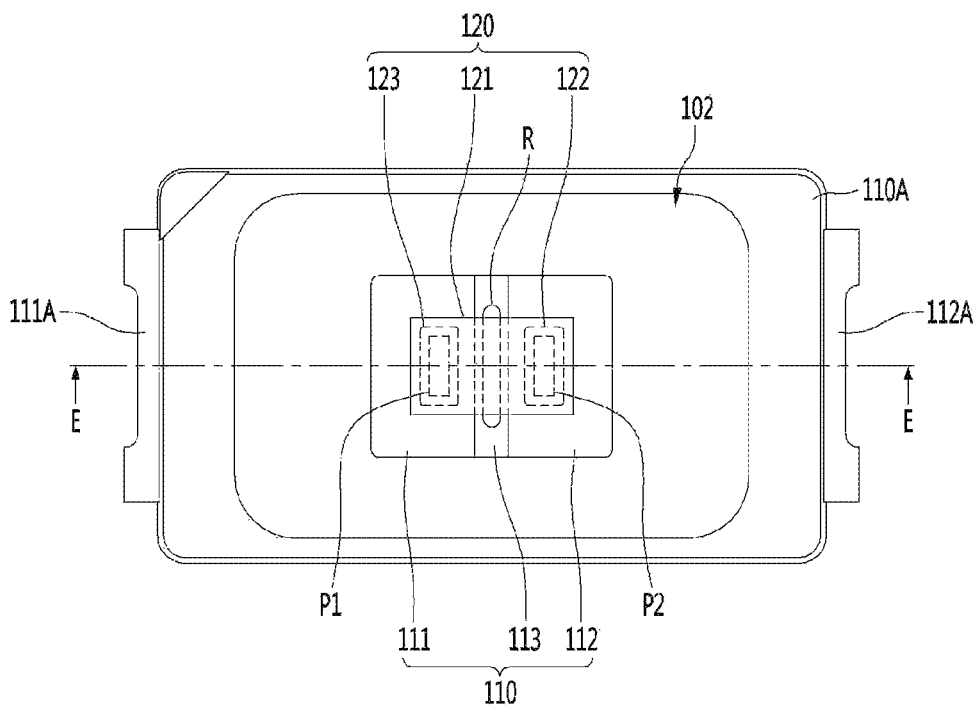
FIG. 7 is a plan view showing a modification of the body of the light emitting device package of FIG. 1.
Figure 8:
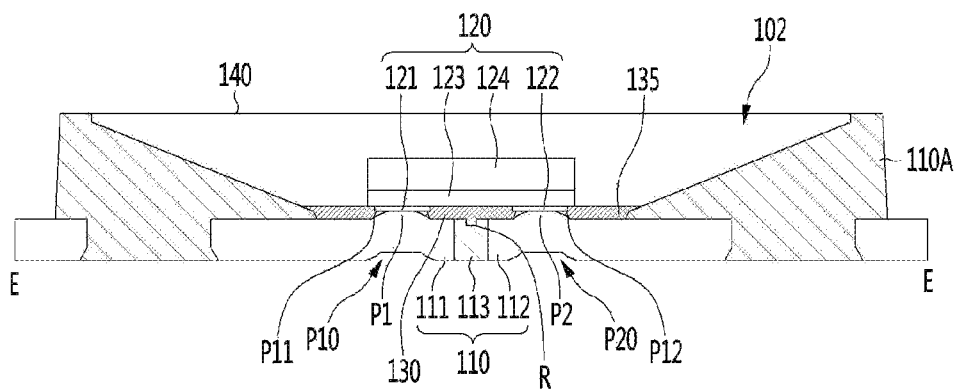
FIG. 8 is a cross-sectional view taken along line E-E of the light emitting device package of FIG. 7.

FIGS. 7 and 8 are another example of the body of the light emitting device package of FIG. 1. In the description of FIGS. 7 and 8, the above-described configuration may be selectively applied, and detailed description thereof will be omitted.

Referring to FIGS. 7 and 8, the light emitting device package may include a recess R in at least one or both of the frames 111 and 112 and the body 113. The recess R may be provided in the body 113, for example. The recess R may be provided between the first protruding portion P1 and the second protruding portion P2. The recess R may be recessed toward a direction of the lower surface from an upper surface of the body 113. The recess R may be disposed under the light emitting device 120. The recess R may overlap the light emitting device 120 in the third direction.

The first resin 130 may be disposed in the recess R. The first resin 130 may be disposed between the light emitting device 120 and the body 113. The first resin 130 may be disposed between the first bonding portion 121 and the second bonding portion 122. For example, the first resin 130 may be disposed in contact with the side surface of the first bonding portion 121 and the side surface of the second bonding portion 122.

A portion of the first resin 130 may be fixed to the recess R and may provide a stable fixing force between the light emitting device 120 and the package body 110. The area of the first resin 130 bonded to the resin material of the body 113 is increased to provide a stable fixing force between the light emitting device 120 and the body 113. The first resin 130 may be disposed in direct contact with the upper surface of the body 113. The first resin 130 may be disposed in direct contact with the lower surface of the light emitting device 120.

For example, the first resin 130 may include at least one of an epoxy material, a silicon material, a hybrid material including an epoxy material and a silicon material. In addition, as an example, when the first resin 130 includes a reflective function, the first resin 130 may include white silicone.

The first resin 130 may be coupled to the recess R to provide a stable fixing force between the body 113 and the light emitting device 120, and light may be emitted to the bottom surface of the light emitting device 120. In this case, a light diffusing function may be provided between the light emitting device 120 and the body 113. When light is emitted from the light emitting device 120 to the bottom surface of the light emitting device 120, the first resin 130 may improve light extraction efficiency of the light emitting device package 100 by providing a light diffusing function. In addition, the first resin 130 may reflect light emitted from the light emitting device 120. When the first resin 130 includes a reflection function, the first resin 130 may be made of a material including TiO2, Silicone, and the like.

According to an embodiment, a depth of the recess R may be provided smaller than the thickness of the frames 111 and 112. The depth of the recess R may be determined in consideration of the adhesive force of the first resin 130. In addition, the depth of the recess R may be determined in consideration the stable strength of the body 113 and/or to prevent cracks in the light emitting device package 100 due to heat generated from the light emitting device 120. The depth of the recess R may be smaller than the thickness of the body 113 disposed between the frames 111 and 112.

The recess R may provide a proper space under the light emitting device 120 in which a kind of underfill process may be performed. Here, the underfill process may be a process of mounting the light emitting device 120 on the package body 110 and then disposing the first resin 130 under the light emitting device 120, or in the process of mounting the light emitting device 120 on the package body 110, the first resin 130 may be a process of disposing in the body 113 and the recess R and then disposing the light emitting device 120. The recess R may be provided to a depth greater than or equal to a first depth so that the first resin 130 is sufficiently provided between the lower surface of the light emitting device 120 and the top surface of the body 113. In addition, the recess R may be provided below a second depth in order to provide stable strength of the body 113.

The width in the first direction of the recess R may be smaller than an interval between the frames 111 and 112. The width of the recess R may be provided in a long axis direction of the light emitting device 120. The width in the first direction of the recess R may be smaller than the width in the first direction of the protruding portions P1 and P2. The depth and width of the recess R may be determined so that sufficient fixing force may be provided by the first resin 130 disposed between the body 113 and the light emitting device 120. For example, the depth of the recess R may be provided to 40 micrometers to 60 micrometers. The width of the recess R may be provided to 140 micrometers to 160 micrometers.

The length of the recess R in the second direction may be longer than the length of the long axis of the light emitting device 120. In this case, the first resin 130 may be exposed to the outside of the light emitting device 120 to perform a light reflection function. The length of the recess R in the second direction may be smaller than the length of the long axis of the light emitting device 120. In this case, the lower surface of the light emitting device 120 may be adhered to the first resin 130.

A first region of the recess R may overlap with the light emitting device 120 in the vertical direction, and a second region may be connected to the first region and may not overlap with the light emitting device 120 in the vertical direction.

One or more recesses R may be disposed in the body 113 disposed between the first and second frames 111 and 113. The outside of the recess R may be disposed outside the side of the light emitting device 120. Both ends of the recess R may be disposed outside the side surfaces of the light emitting device 120. The recess R may have a top view shape in a circle shape, an ellipse shape, or a polygonal shape. The side cross-sectional shape of the recess R may be a hemispherical shape, a shape having a curved surface, or a polygonal shape.

According to the embodiment, since the protruding portions P1 and P2 of the frames 111 and 113 are disposed under the light emitting device 120, an interval between the lower surface of the light emitting device 120 and the frames 111 and 112 and an interval between the light emitting device 120 and the body 113 may be larger than a structure without the protruding portions. Accordingly, since a thickness of the first resin 130 and the second resin 135 may be increased, a lower adhesive force and a supporting force of the light emitting device 120 may be enhanced. In addition, since the interval between the light emitting device 120 and the frames 111 and 112 is further spaced apart, it is possible to increase the thickness of the second resin 135 and to prevent a short problem on the side of the light emitting device 120. In addition, the light reflection efficiency by the second resin 135 may be improved.

In the light emitting device package according to the embodiment, the recess may be further disposed under the frames 111 and 112 to strengthen the coupling with the body. By providing a stepped structure on the lower portions of the frames 111 and 112, the coupling with the body may be strengthened and the spreading of the solder may be adjusted.

Figure 9:
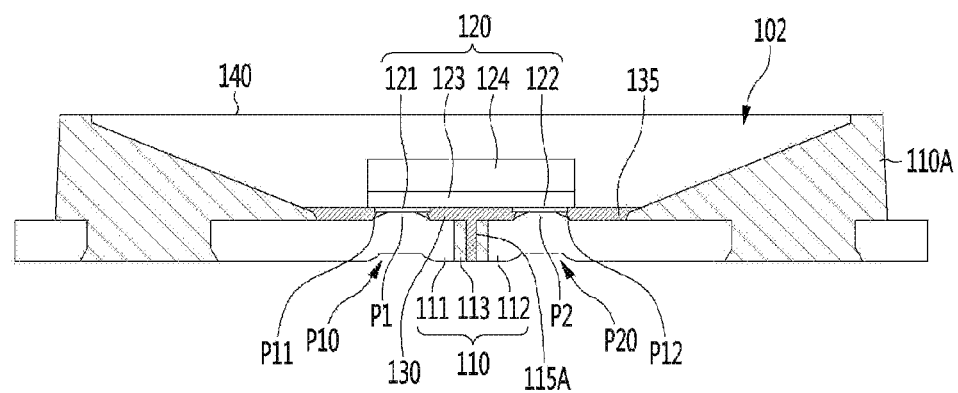
FIG. 9 is another example of the light emitting device package of FIG. 7.

FIG. 9 is a modified example of a recess in the light emitting device package of FIGS. 7 and 8. Referring to FIG. 9, in the description of FIG. 9, the above-described configuration may be selectively applied, and detailed description thereof will be omitted.

Referring to FIG. 9, the light emitting device package may include through holes in at least one or both of the frames 111 and 112 and the body 113. The through hole 115A may be provided in the body 113, for example. The through hole 115A may be provided between the first protruding portion P1 and the second protruding portion P2. The through hole 115A may be provided to penetrate from the upper surface of the body 113 to the lower surface of the body 113. The through hole 115A may be disposed under the light emitting device 120. The through hole 115A may overlap the light emitting device 120 in the third direction.

The first resin 130 may be disposed in the through hole 115A. The first resin 130 may be disposed between the light emitting device 120 and the body 113. The first resin 130 may be disposed between the first bonding portion 121 and the second bonding portion 122. For example, the first resin 130 may be disposed in contact with a side surface of the first bonding portion 121 and a side surface of the second bonding portion 122. When the first resin 130 is formed, the first resin 130 may be formed in the through hole 115A after the supporting sheet is disposed on the bottom of the package body 110.

The first resin 130 may be disposed on the through hole 115A and the body 113 to provide a stable fixing force between the light emitting device 120 and the package body 110. The area of the first resin 130 adhered to the resin material of the body 113 is increased to provide a stable fixing force between the light emitting device 120 and the body 113. For example, the first resin 130 may be disposed in direct contact with an upper surface of the body 113. The first resin 130 may be disposed in direct contact with the lower surface of the light emitting device 120. The first resin 130 may be exposed on the lower surface of the body 113.

For example, the first resin 130 may include at least one of an epoxy material, a silicon material, a hybrid material including an epoxy material and a silicon material. For example, the first resin 130 may include a material that reflects or diffuses light. The first resin 130 may include a thermally conductive material. The configuration of the first resin 130 will be referred to the description disclosed above.

According to an embodiment, the depth of the through hole 115A may be equal to the thickness of the frames 111 and 112. The width of the through hole 115A may be considered a stable strength of the body 113 and/or may be determined so that a crack does not occur in the light emitting device package 100 by heat emitted from the light emitting device 120.

The width in the first direction of the through hole 115A may be smaller than an interval between the frames 111 and 112. The width of the through hole 115A may be provided in the long axis direction of the light emitting device 120. The width of the through hole 115A in the first direction may be smaller than the width of the protruding portions P1 and P2 in the first direction. The length of the through hole 115A may be smaller or larger than the length of the light emitting device 120 in the long axis direction, for example, the length in the second direction.

According to the embodiment, since the protruding portions P1 and P2 of the frames 111 and 113 are disposed under the light emitting device 120, an interval between the lower surface of the light emitting device 120 and the frames 111 and 112 and an interval between the upper surface of the light emitting device 120 and the body 113 may be larger than a structure without the protruding portions. Accordingly, the thicknesses of the first resin 130 and the second resin 135 may be secured, thereby enhancing the lower adhesive force and the supporting force of the light emitting device 120. In addition, since the interval between the light emitting device 120 and the frames 111 and 112 is further spaced apart, it is possible to increase the thickness of the second resin 135 may prevent the short problem on the side of the light emitting device 120. In addition, the light reflection efficiency by the second resin 135 may be improved.

In the light emitting device package according to the embodiment, the through hole may be further disposed below the frames 111 and 112 to strengthen the coupling with the body. In addition, by providing a stepped structure in the lower portion of the frames 111 and 112, the coupling with the body may be strengthened and the spreading of the solder may be adjusted.

Figure 10:
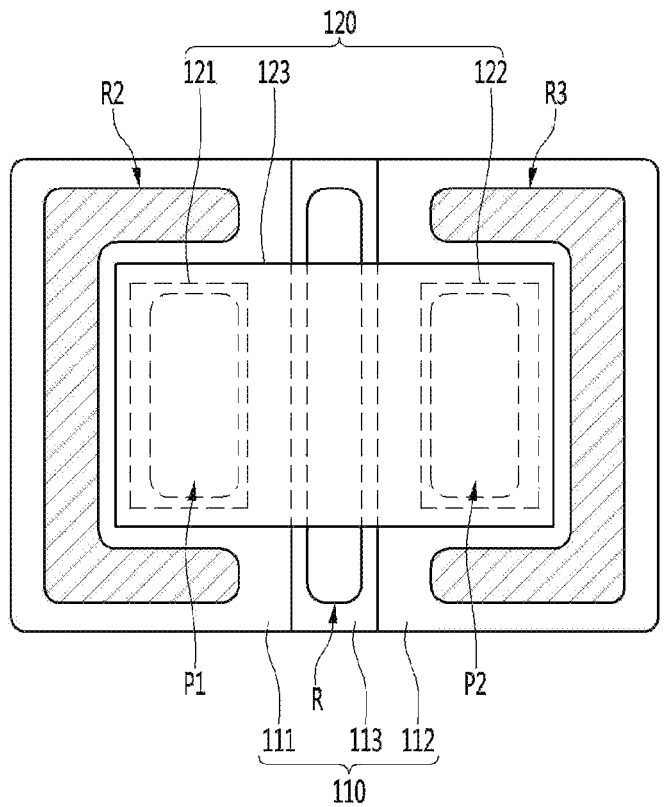
FIG. 10 is a view showing a modification of the frame in the light emitting device package of FIG. 7.
Figure 11:
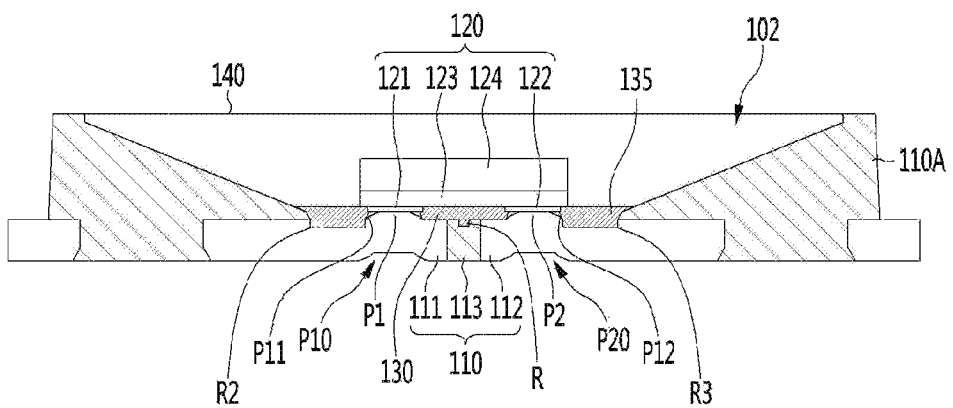
FIG. 11 is an example of a light emitting device package having the modified frame of FIG. 10.

FIG. 10 is a modified example of a body and a frame of the frame in the light emitting device package of FIG. 1, and FIG. 11 is an example of a side sectional view in which the structure of FIG. 10 is applied to the package of FIG. 1.

Referring to FIGS. 10 and 11, the light emitting device package may include a first upper recess R2 and a second upper recess R3. The first upper recess R2 may be provided on an upper surface of the first frame 111. The first upper recess R2 may be concave in a direction of the lower surface from the upper surface of the first frame 111. The first upper recess R2 may be spaced apart from the first protruding portion P1. As shown in FIG. 10, the first upper recess R2 may be provided adjacent to three sides of the first bonding portion 121 when viewed from an upper direction. For example, the first upper recess R2 may be disposed along the periphery of the first bonding portion 121.

The second upper recess R3 may be provided on the upper surface of the second frame 112. The second upper recess R3 may be concave in a direction of the lower surface from the upper surface of the second frame 112. The second upper recess R3 may be spaced apart from the second protruding portion P2. As shown in FIG. 10, the second upper recess R3 may be provided adjacent to three sides of the second bonding portion 122 when viewed from the upper direction. For example, the second upper recess R3 may be provided along each side of the second bonding portion 122.

For example, the second resin 135 may be included in the first upper recess R2 and the second upper recess R3. The second resin 135 may be provided in the first upper recess R2 and the second upper recess R3. The second resin 135 may be disposed on side surfaces of the first and second bonding portions 121 and 122. The second resin 135 may be provided in the first and second upper recesses R2 and R3, and may extend to an area where the first and second bonding portions 121 and 122 are disposed. The second resin 135 may be disposed under the semiconductor layer 123. The distance from the ends of the first and second upper recesses R2 and R3 to the adjacent ends of the light emitting device 120 may be provided equal to or smaller than 200 micrometers. The upper recesses R2 and R3 may be connected to each other along the upper periphery of the frames 111 and 112 and the body 113. The second resin 135 may be disposed on the upper recesses R2 and R3 to have a boundary surface with the first resin 130 or to contact each other.

The second resin 135 may also be provided on side surfaces of the semiconductor layer 123. The second resin 135 may be disposed on the side surface of the semiconductor layer 123 to effectively prevent the first and second conductive layers 321 and 322 from moving to the side surface of the semiconductor layer 123. In addition, when the second resin 135 is disposed on the side surface of the semiconductor layer 123, the second resin 135 may be disposed under the active layer of the semiconductor layer 123, thereby improving light extraction efficiency of the light emitting device 120.

For example, the second resin 135 may include at least one of an epoxy-based material, a silicon-based material, a hybrid material including an epoxy-based material and a silicon-based material. In addition, the second resin 135 may include a reflective material, and may include, for example, white silicone including TiO2 and/or Silicone.

Figure 12:
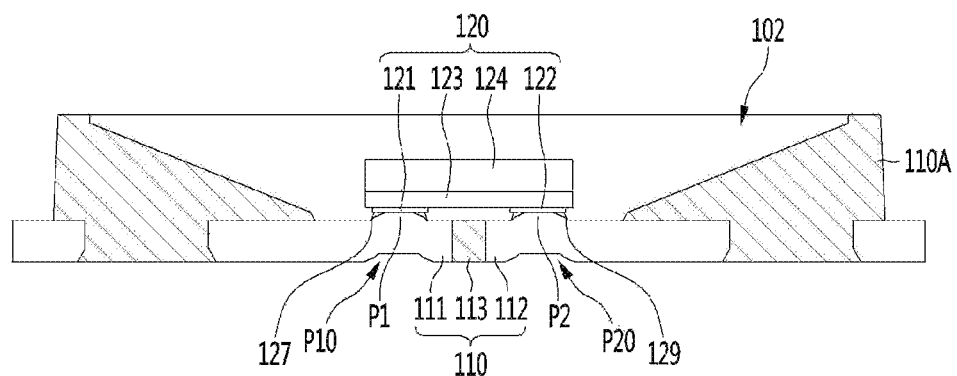
FIGS. 12 to 14 are views illustrating a manufacturing process of a light emitting device package according to a first embodiment of the invention.
Figure 13:
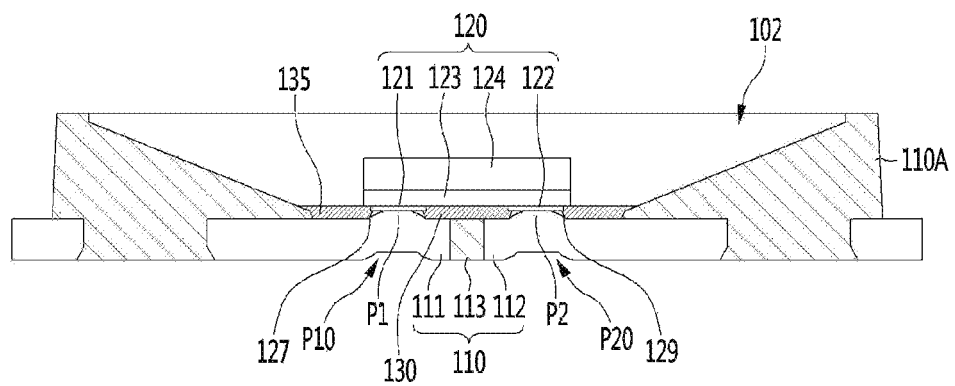
Figure 14:
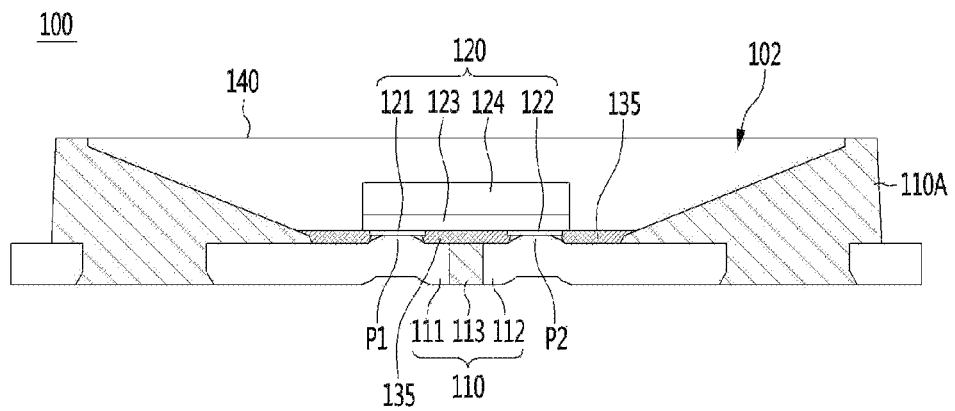

FIGS. 12 to 14 will be described a method of manufacturing the light emitting device package according to an embodiment of the present invention. Referring to FIGS. 12 to 14, in the method of manufacturing the light emitting device package according to an exemplary embodiment of the present invention, the descriptions of the overlapping contents described with reference to FIGS. 1 to 3 may be omitted.

As shown in FIG. 12, the light emitting device package is provided with a package body 110. The package body 110 may include the first frame 111 and the second frame 112. The first frame 111 and the second frame 112 may be spaced apart from each other. The first frame 111 may include the first protruding portion P1. The second frame 112 may include the second protruding portion P2. The package body 110 may include, but is not limited to, a recess provided in the body 113 and/or an upper recess of the frames. The recess or upper recess will be referred to the description disclosed above.

After the conductive layers 127 and 129 are formed on the protruding portions P1 and P2, the first and second bonding portions 121 and 122 of the light emitting device 120 are aligned and attached to overlap the protruding portions P1 and P2. The first conductive layer 127 may be disposed in direct contact with the lower surface of the first bonding portion 121. The first conductive layer 127 may be electrically connected to the first bonding portion 121. The second conductive layer 129 may be disposed in direct contact with the lower surface of the second bonding portion 122. The second conductive layer 129 may be electrically connected to the second bonding portion 122. For example, the conductive layers 127 and 129 may be formed using a conductive paste, and the conductive layers 127 and 129 may be formed through solder paste or silver paste. The conductive layers 127 and 129 may form an intermetallic compound layer by combining a material constituting the bonding portions 121 and 122 with a material constituting the frames 111 and 112. An alloy layer formed of the intermetallic compound layer may include at least one selected from the group including AgSn, CuSn, AuSn, etc. The intermetallic compound layer may be formed by a combination of a first material and a second material, the first material may be provided from the conductive layers 127 and 129, and the second material may be provided from the bonding portions 121 and 122 or the frames 111 and 112.

As shown in FIG. 13, the second resin 135 and the first resin 130 are formed in the light emitting device package. In the case where the second resin 135 and the first resin 130 are formed of the same material, the second resin 135 and the first resin 130 may be processed in the same process or may be processed in another process. The second resin 135 and the first resin 130 may be the same material or different materials. The second resin 135 and the first resin 130 may be disposed on the package body 110, and may be formed on the first frame 111, the second frame 112, and the body 113. The second resin 135 may be disposed between the first frame 111 and the light emitting device 120. The second resin 135 may be disposed between the second frame 112 and the light emitting device 120.

The second resin 135 may be disposed on side surfaces of the first bonding portion 121 and the first conductive layer 127. The second resin 135 may be disposed on the side surface of the second bonding portion 122. The second resin 135 may be disposed under the semiconductor layer 123. For example, the second resin 135 may include at least one of an epoxy-based material, a silicon-based material, a hybrid material including an epoxy-based material and a silicon-based material. May be. For example, the second resin 135 may be a reflective portion that reflects light emitted from the light emitting device 120. For example, the second resin 135 may be a resin including a reflective material such as TiO2. The second resin 135 may include white silicone.

The second resin 135 and the first resin 130 may be disposed under the light emitting device 120 to perform a sealing function. In addition, the second resin 135 and the first resin 130 may improve the adhesion between the light emitting device 120 and the first frame 111. The second resin 135 may improve the adhesion between the light emitting device 120 and the second frame 112.

When the second resin 135 and the first resin 130 include a material having reflective properties such as white silicon, the second resin 135 receives light provided from the light emitting device 120 in the package. The light extraction efficiency of the light emitting device package 100 may be improved by reflecting toward the upper direction of the body 110.

Referring to FIG. 14, a molding portion 140 may be provided on the light emitting device 120. The molding portion 140 may be provided on the light emitting device 120. The molding portion 140 may be disposed on the first frame 111 and the second frame 112. The molding portion 140 may be disposed in the cavity 102 provided by the reflective portion 110A of the package body 110. The molding portion 140 may be disposed on the second resin 135.

The molding portion 140 may include an insulating material. In addition, the molding portion 140 may include wavelength conversion means for receiving the light emitted from the light emitting device 120 and providing the wavelength-converted light. For example, the molding portion 140 may be at least one selected from the group including phosphors, quantum dots, and the like. The molding portion 140 may be formed as a single layer or a multilayer, and in the case of the multilayer, any one layer may be free of impurities such as phosphors, and the other layer may have impurities such as phosphors.

In the light emitting device package 100 according to the embodiment, a power is connected to the first bonding portion 121 through the first protruding portion P1, and is connected to the second bonding portion 122 through the second bonding portion P2. Accordingly, the light emitting device 120 may be driven by driving power supplied through the first bonding portion 121 and the second bonding portion 122. In addition, the light emitted from the light emitting device 120 may be provided in an upper direction of the package body 110.

On the other hand, the light emitting device package 100 according to the embodiment may be supplied mounted on a sub-mount or a circuit board. However, in the conventional light emitting device package is mounted on a sub-mount or a circuit board, a high temperature process such as a reflow may be applied. In this case, in the reflow process, a re-melting phenomenon may occur in a bonding region between the frame and the light emitting device provided in the light emitting device package. Accordingly, there is an advantage that the electrical connection and the physical bonding force in the bonding portion do not deteriorate. Therefore, the position of the light emitting device may be changed, and the optical, electrical properties, and reliability of the light emitting device package may be degraded. However, according to the light emitting device package and the method of manufacturing the light emitting device package according to the embodiment, the bonding portions of the light emitting device according to the embodiment may be provided with a driving power through the protruding portion and the conductive layer. In addition, the melting point of the protruding portion and the conductive layer may be selected to have a higher value than the melting point of the general bonding material. Accordingly, the light emitting device package according to the embodiment does not cause re-melting even when bonded to a main substrate through a reflow process, so that the electrical connection and physical bonding force are not degraded.

According to the manufacturing method of the light emitting device package 100 and the light emitting device package according to the embodiment, the package body 110 does not need to be exposed to high temperatures in the process of manufacturing the light emitting device package. Therefore, according to the embodiment, the package body 110 may be prevented from being damaged or discolored due to exposure to high temperature. Accordingly, the selection range for the material constituting the body 113 may be widened. According to an embodiment, the body 113 may be provided using a relatively inexpensive resin material as well as an expensive material such as a ceramic. For example, the body 113 includes at least one material selected from the group consisting of a Polyphthalamide (PPA) resin, a Polycyclohexylenedimethylene terephthalate (PCT) resin, an epoxy molding compound (EMC) resin, and a silicone molding compound (SMC) resin.

Second Embodiment

To begin with, a light emitting device package according to an exemplary embodiment of the present invention will be described with reference to FIGS. 15 to 21.

Figure 15:
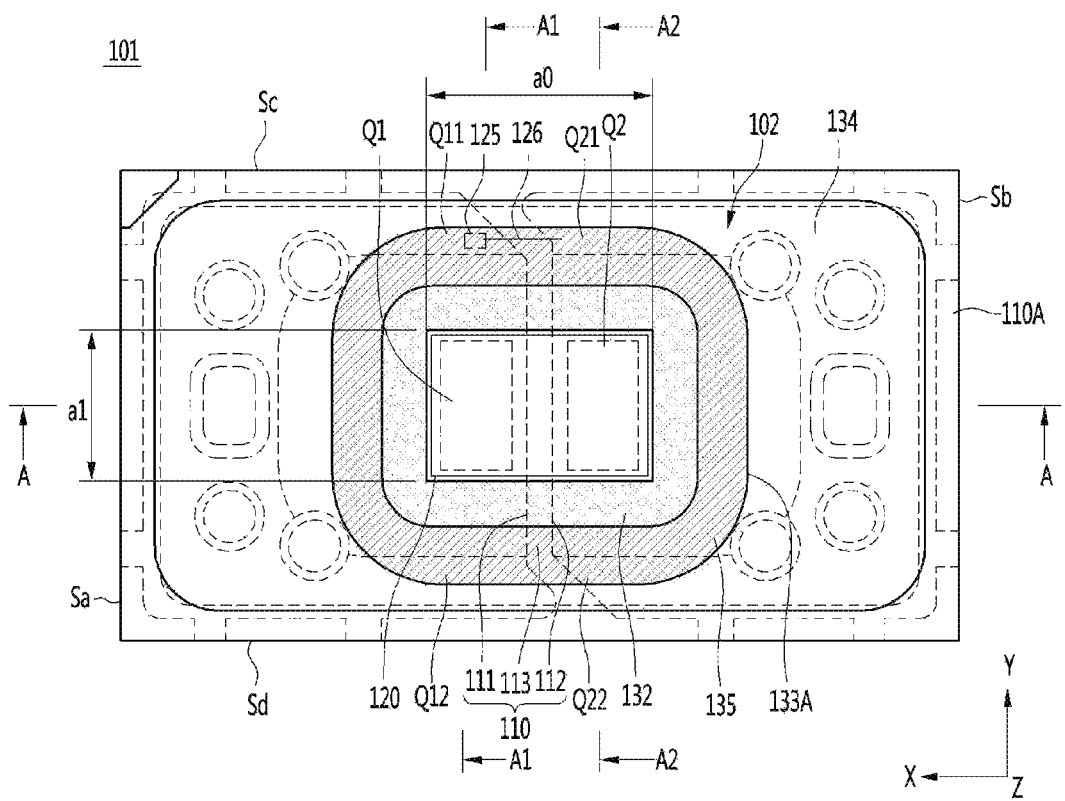
FIG. 15 is a plan view of a light emitting device package according to a second embodiment of the present invention.
Figure 16:
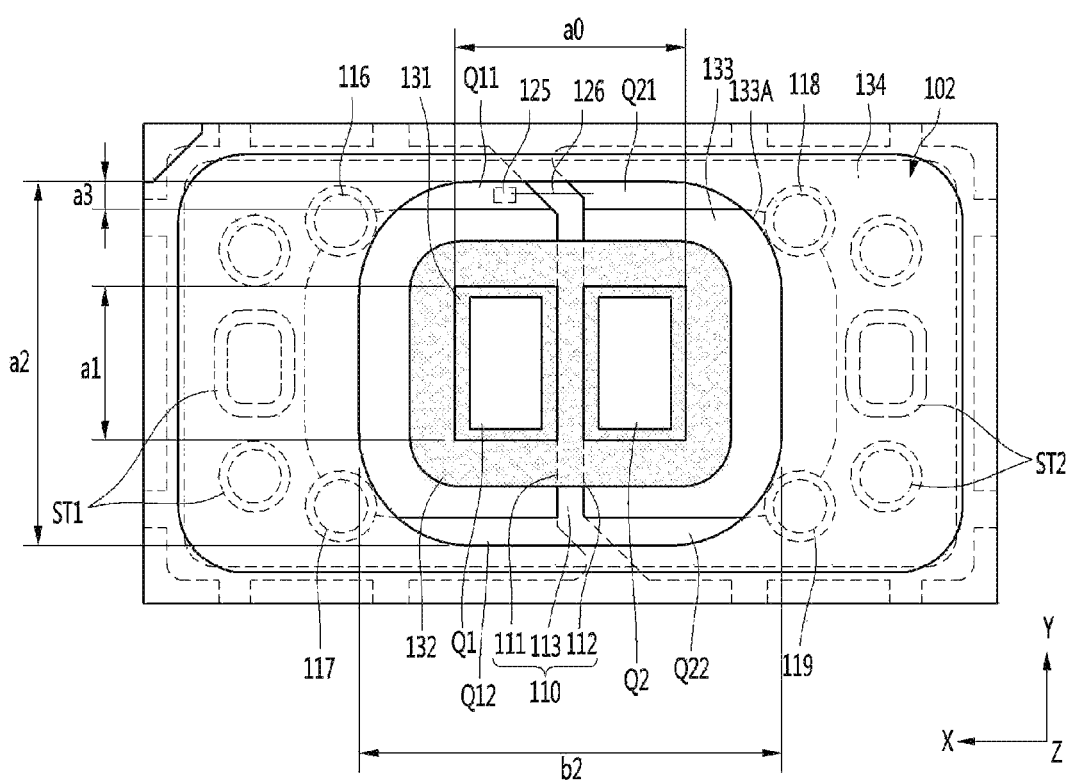
FIG. 16 is a view illustrating a bottom of the cavity in FIG. 15.
Figure 17:
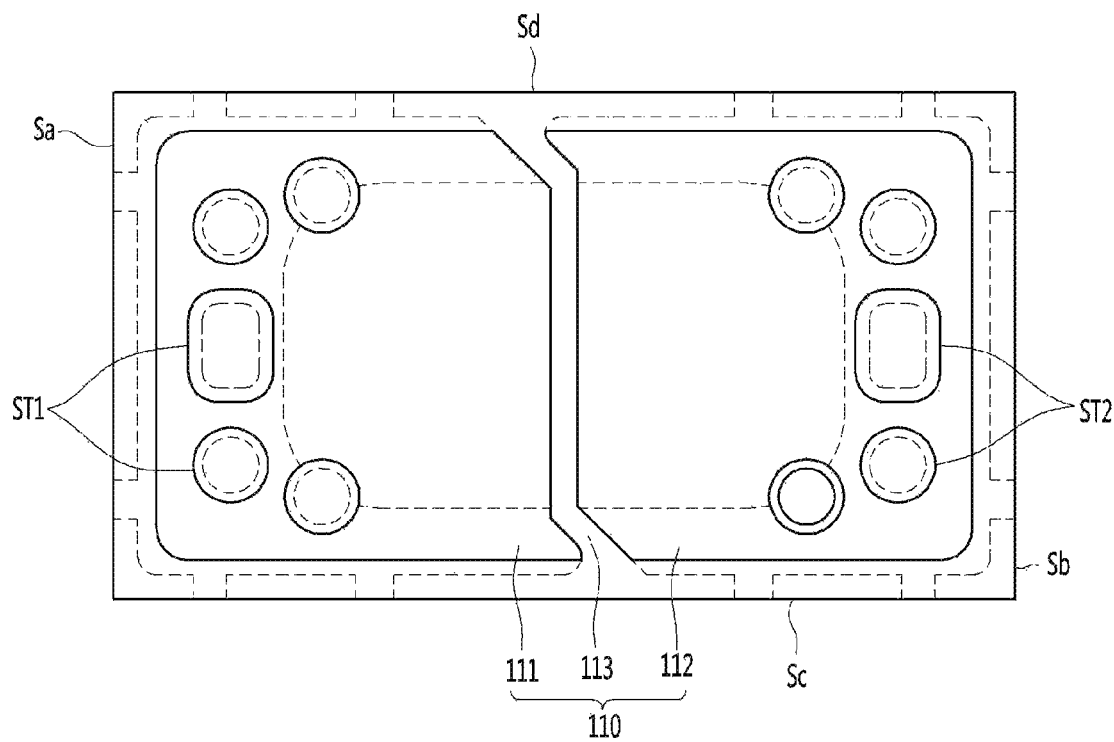
FIG. 17 is a bottom view of the light emitting device package of FIG. 15.
Figure 18:
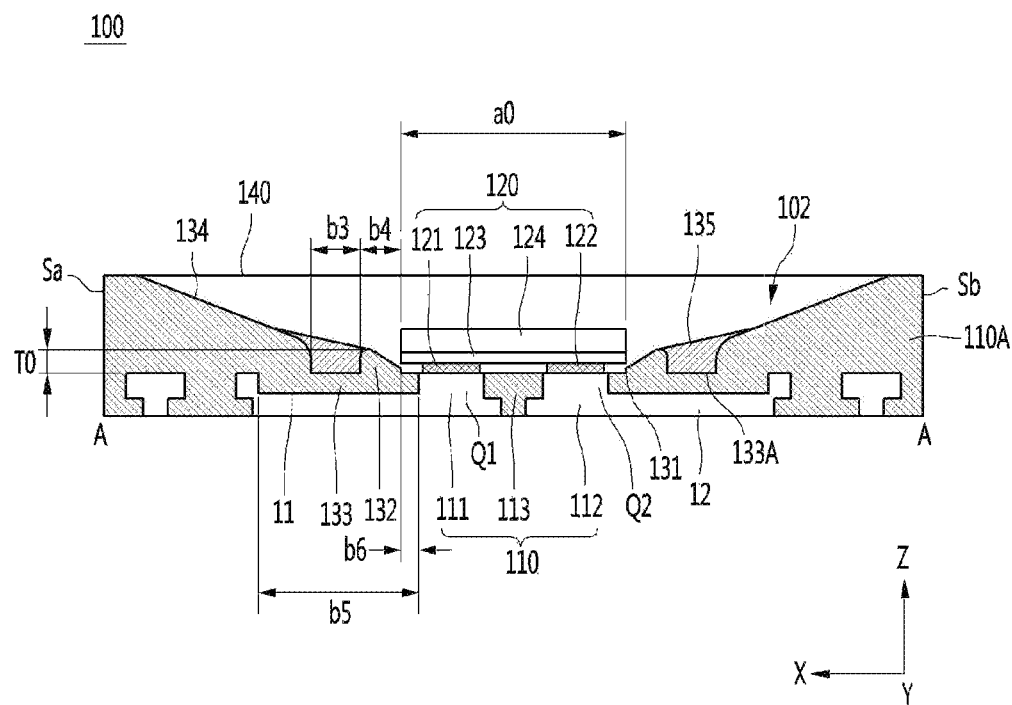
FIG. 18 is a cross-sectional view taken along the line A-A of the light emitting device package shown in FIG. 15.
Figure 19:
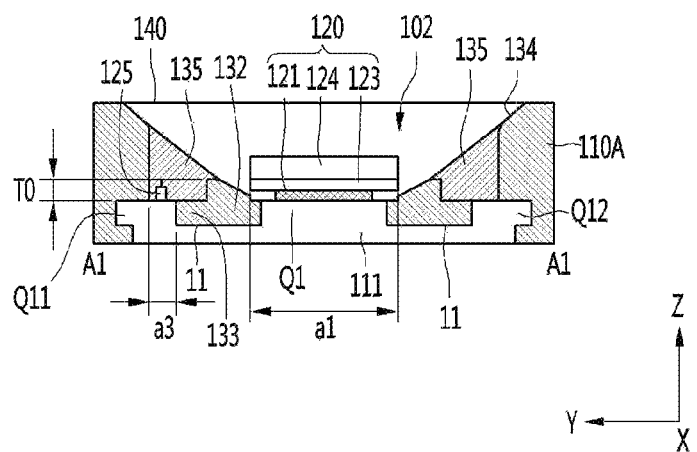
FIG. 19 is a cross-sectional view taken along line A1-A1 of the light emitting device package shown in FIG. 15.
Figure 20:
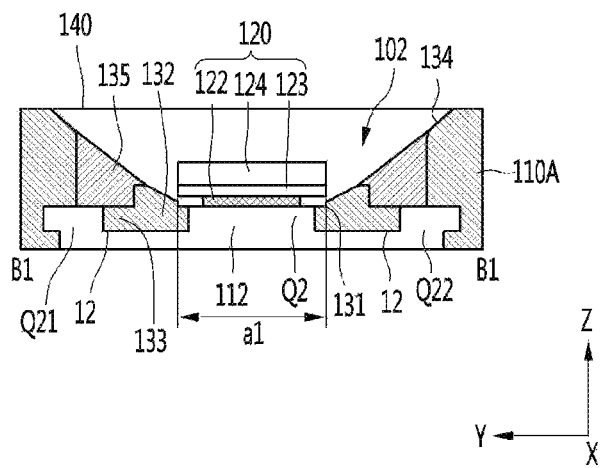
FIG. 20 is a cross-sectional view taken along line A2-A2 of the light emitting device package shown in FIG. 15.
Figure 21:
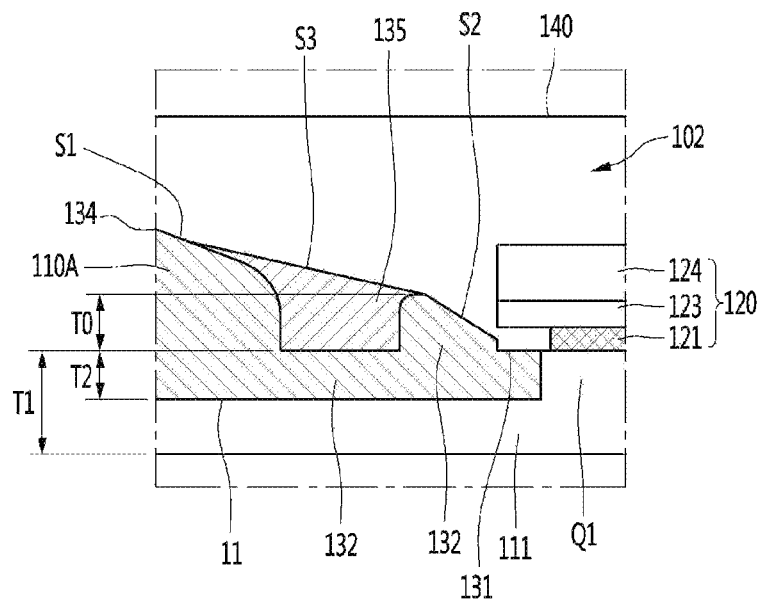
FIG. 21 is an enlarged view of a portion where the light emitting device of FIG. 18 is disposed.

FIG. 15 is a plan view of a light emitting device package according to an embodiment of the present invention, FIG. 16 is a view illustrating a cavity bottom in FIG. 15, FIG. 17 is a bottom view of the light emitting device package of FIG. 15, FIG. 18 is a cross-sectional view taken along line A-A of the light emitting device package shown in FIG. 15, FIG. 19 is a cross-sectional view taken along line A1-A1 of the light emitting device package shown in FIG. 15, FIG. 20 is a cross-sectional view taken along line A2-A2 of the light emitting device package shown in FIG. 15, and FIG. 21 is an enlarged view of a portion where a light emitting device is disposed in the light emitting device package of FIG. 18.

Referring to FIGS. 15 to 21, the light emitting device package 101 according to the embodiment may include a package body 110 and a light emitting device 120.

The package body 110 may include a plurality of frames, for example, a first frame 111 and a second frame 112. The first frame 111 and the second frame 112 may be spaced apart from each other in the first direction X. The package body 110 may include a body 113. The body 113 may be disposed between the first frame 111 and the second frame 112. The body 113 may perform a function of a kind of electrode separation line. The body 113 may be referred to as an insulating member.

A portion of the body 113 may be disposed on the first frame 111. A portion of the body 113 may be disposed on the second frame 112. The body 113 may provide an inclined surface disposed on the first frame 111 and the second frame 112. A cavity 102 may be provided on the first frame 111 and the second frame 112 by the inclined surface of the body 113. According to an embodiment, the package body 110 may be provided in a structure having a cavity 102, or may be provided in a structure having a flat top surface without the cavity 102. The package body 110 may provide a reflective portion 110A having the cavity 102. The reflective portion 110A may cover the periphery of the cavity 102 and be coupled to the body 110. For example, the body 113 may include the material disclosed in the first embodiment. The reflective portion 110A may be made of the same material as the body 113. As another example, the reflective portion 110A may be made of a material different from that of the body 113.

The side surface of the cavity 102 may include a first side portion 132 spaced apart from the light emitting device 120 and disposed around the light emitting device 120. The side surface of the cavity 102 may include a groove portion 133A disposed around the first side portion 132, and a second side portion 134 disposed around the groove portion 133A. The second side portion 134 is a surface disposed on the groove portion 133A and may be an upper side surface. The groove portion 133A may be disposed between the first side portion 132 and the second side portion 134. The first side portion 132 and the second side portion 134 may be disposed around the light emitting device 120.

The first frame 111 and the second frame 112 may be provided as a conductive frame. The first frame 111 and the second frame 112 may be lead frames. The first frame 111 and the second frame 112 may stably provide structural strength of the package body 110, and may be electrically connected to the light emitting device 120. The first extension portion of the first frame 111 may extend in direction of an outer side of the package body 110 and may be exposed or protrude. The second extension portion of the second frame 112 may extend in a direction of the outer side of the package body 110 and may be exposed or protruded.

Referring to FIGS. 16 and 17, the first and second frames 111 and 112 may include hole structures ST1 and ST2 coupled to the body 113 and/or the reflective portion 110A. One or more hole structures ST1 and ST2 may be disposed in each of the frames 111 and 112. The hole structures ST1 and ST2 may have a lower width that is wider than an upper width, but is not limited thereto. Each of the frames 111 and 112 may have a hemispherical step structure which an outer direction is open, but is not limited thereto.

As another example, the first frame 111 and the second frame 112 may be provided as an insulating frame. The first frame 111 and the second frame 112 may stably provide structural strength of the package body 110.

In example embodiments, the light emitting device 120 may include a first bonding portion 121, a second bonding portion 122, and a semiconductor layer 123. The light emitting device 120 may include a substrate 124. The light emitting device 120 may have a length in the first direction longer than a length in the second direction.

The substrate 124 and the semiconductor layer 123 will be referred to the description disclosed in the first embodiment, and the configuration of the first embodiment may be selectively applied.

The light emitting device 120 may include first and second bonding portions 121 and 122 at a lower portion thereof. The first bonding portion 121 and the second bonding portion 122 may be spaced apart from each other on the lower surface of the light emitting device 120. The first and second bonding portions 121 and 122 may be spaced apart from each other in the first direction. The first bonding portion 121 may be disposed on the first frame 111. The second bonding portion 122 may be disposed on the second frame 112. The light emitting device 120 may have a flip chip structure or a horizontal chip arranged in a flip shape.

The first bonding portion 121 may be disposed between the semiconductor layer 123 and the first frame 111. The second bonding portion 122 may be disposed between the semiconductor layer 123 and the second frame 112. The first bonding portion 121 and the second bonding portion 122 may be formed in a single layer or multiple layers using one or more materials or alloys of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/Au/ITO.

In the light emitting device package 100 according to the embodiment, a power is connected to the first bonding portion 121 through the first flat portion Q1, and is connected to the second bonding portion through the second flat portion Q2. Accordingly, the light emitting device 120 may be driven by driving power supplied through the first bonding portion 121 and the second bonding portion 122. In addition, the light emitted from the light emitting device 120 may be provided in an upper direction of the package body 110.

The light emitting device 120 may be disposed on the package body 110. The light emitting device 120 may be disposed on the first frame 111 and the second frame 112. The light emitting device 120 may be disposed on the body 113. The light emitting device 120 may be disposed in the cavity 102 provided by the package body 110.

Referring to FIGS. 15 to 19, the light emitting device package 100 according to the embodiment may include the first flat portion Q1 and the second flat portion Q2. The first frame 111 may include the first flat portion Q1. The second frame 112 may include the second flat portion Q2.

The first flat portion Q1 and the second flat portion Q2 overlap the light emitting device 120 in the third direction among the first and second frames 111 and 112, and may be a flat region which the light emitting device 120 may be disposed. The first flat portion Q1 and the second flat portion Q2 may be regions protruding from the bottom of the first and second upper recesses 11 and 12. The first and second flat portions Q1 and Q2 may be arranged in an island shape by the upper recesses 11 and 12 disposed around the first and second flat portions Q1 and Q2. The first flat portion Q1 may be spaced apart from other flat portions on the first frame 111. The second flat portion Q2 may be spaced apart from other flat portions on the first frame 112. An upper surface area of the first flat portion Q1 may be disposed in a range of 20% or more, for example, in a range of 20% to 45% of an area of the lower surface of the light emitting device 120. An upper surface area of the second flat portion Q2 may be disposed in a range of 20% or more, for example, in a range of 20% to 45% of the area of the lower surface of the light emitting device 120. When the areas of the upper surface of the first and second flat portions Q1 and Q2 are smaller than the range, the heat transfer efficiency may be lowered, and when the area of the upper and lower surfaces are larger than the range, the electrical interference between the two frames 111 and 112 may occur. The areas of the upper surface of the first and second flat portions Q1 and Q2 may be the same or one may be larger than the others.

The first and second flat portions Q1 and Q2 may be spaced apart from each other in the first direction on the bottom of the cavity 102. The first and second flat portions Q1 and Q2 may be spaced apart by the width of the body 113 disposed between the first and second frames 111 and 112. The first flat portion Q1 may be provided in the first frame 111. The first flat portion Q1 may protrude from the first frame 111. The first flat portion Q1 may be provided to protrude from the upper and lower surfaces of the first frame 111 in the third direction Z. The first direction may be a direction in which an imaginary line connecting the centers of the first and second flat portions Q1 and Q2 extends.

Referring to FIGS. 18 and 21, the first frame 111 includes the first upper recess 11 around the first flat portion Q1, and the first upper recess 11 may be a lower region than the upper surface of the first flat portion Q1. The first upper recess 11 may be a half etching region. The first upper recess 11 is disposed at a depth T2 smaller than the thickness of the first flat portion Q1, for example, 40% or more, for example, in a range of 40% to 60% of the thickness of the first flat portion Q1. The thickness of the first flat portion Q1 may be the thickness T1 of the first frame 111, that is, the maximum thickness of the first frame 111. The thickness T1 of the first frame 111 may be 180 micrometers or more, for example, in the range of 180 to 300 micrometers. The depth T2 of the first upper recess 11 may be 100 micrometers or more, for example, in the range of 100 to 150 micrometers. If the depth T2 of the first upper recess 11 is greater than the range, the hardness of the frames 111 and 112 may be lowered. If the depth T2 of the first upper recess 11 is greater than the range, the bonding strength of the resin may be lowered and the resin may be a thinner, which may be degraded by the reflection efficiency.

The second frame 113 includes the second upper recess 12 around the second flat portion Q2, and the second upper recess 12 may be a lower region than the upper surface of the second flat portion Q2. The second upper recess 12 may be a half etching region. The second upper recess 12 is disposed at a depth smaller than the thickness of the second flat portion Q2, for example, 40% or more, for example, in a range of 40% to 60% of the thickness of the second flat portion Q2. The thickness of the second flat portion Q2 may be the thickness T1 of the second frame 112, that is, the maximum thickness of the second frame 112. The thickness T1 of the second frame 112 may be 180 micrometers or more, for example, in the range of 180 to 300 micrometers. The depth T0 of the second upper recess 12 may be 100 micrometers or more, for example, in the range of 100 to 150 micrometers. If the depth T0 of the second upper recess 12 is greater than the range, the hardness of the frames 111 and 112 may be lowered. If the depth T0 of the second upper recess 12 is less than the range, the bonding strength of the resin may be lowered and the resin may be a thinner, which may be degraded by the reflection efficiency. The thickness T1 of the first and second frames 111 and 112 may be the thickness a of the frames 111 and 112 described with reference to FIG. 5.

Referring to FIGS. 18 and 19, the width b5 of the first upper recess 11 in the first direction may be greater than the width of the second direction based on the first flat portion Q1. The width b5 of the first upper recess 11 in the first direction may be 800 micrometers or more, for example, in a range of 800 to 1400 micrometers. Due the width b5, the first upper recess 11 may overlap a portion of the second side portion 134 or the side surface of the cavity in the third direction and may be provided a space for forming of the first side portion 132 and the groove portion 133A.

Referring to FIGS. 18 and 20, the width of the second upper recess 12 in the first direction may be greater than the width of the second direction based on the second flat portion Q2. The width of the second upper recess 12 in the first direction may be 800 micrometers or more, for example, in a range of 800 to 1400 micrometers. Due to the width, the second upper recess 12 may overlap a portion of the second side portion 134 in the third direction, and may provide a space for forming the second side portion 134 and the groove portion 133A.

The first and second frames 111 and 112 may have the same thickness. The first flat portion Q1 and the second flat portion Q2 may have the same thickness. The first and second upper recesses 11 and 12 may be regions recessed to the same depth T0.

The first upper recess 11 and the second upper recess 12 may be connected to each other. In the body 113, a thickness of a region disposed between the first flat portion Q1 and the second flat portion Q2 may be thicker than a thickness of a region disposed between the first and second upper recesses 11 and 12. That is, since the body 113 disposed between the first and second upper recesses 11 and 12 is disposed between the frames supporting the first and second upper recesses 11 and 12, a thickness of the body disposed between the first and second upper recesses 11 and 12 may be thinner than the thickness of the body 113 disposed between the first and second flat portions Q1 and Q2. Accordingly, the first and second upper recesses 11 and 12 may be connected to each other. An upper direction of the first upper recess 11 may be opened, and a region between the first and second frames 111 and 112 may be opened. That is, the first upper recess 11 may be opened toward the body 113. An upper direction of the second upper recess 12 may be open, and the region between the first and second frames 111 and 112 may be opened. That is, the second upper recess 12 may be opened toward the body 113.

Referring to FIGS. 16 and 19, the first and second frames 111 and 112 may include a region where at least one portion of the first and second frames 111 and 112 is exposed on the bottom surface of the groove portion 133A. The region of the first and second frames 111 and 112 exposed to the groove portion 133A may be a region in which the protection device 125 is disposed. The first frame 111 may include a region exposed to the groove portion 133A, and may include, for example, a first region Q11 and a second region Q12. The first region Q11 and the second region Q12 may be spaced apart in the second direction from the outside of the first flat portion Q1. The first and second regions Q11 and Q12 may be disposed outside of the first upper recess 11 in the second direction and exposed to the bottom of the cavity 102. An interval between the first and second regions Q11 and Q12 may be greater than a length in the second direction of the first flat portion Q1. An interval between the first and second regions Q11 and Q12 may be smaller than the bottom width a2 of the cavity 102 in the second direction. The bottom width b2 in the first direction of the cavity 102 may be equal to or larger than a2. The bottom widths a2 and b2 may be 2 mm or more, for example, in the range of 2 mm to 3 mm.

The first and second regions Q11 and Q12 may be parts in which the upper portion of the first frame 111 is exposed from the bottom of the cavity 102. The width a3 in the second direction of the first and second regions Q11 and Q12 may be wider than the bottom width of the protection device 125, for example, 100 micrometers or more, or in a range of 100 to 200 micrometers. The length of the first and second regions Q11 and Q12 in the first direction may be longer than the width of the first and second regions Q11 and Q12. The first region Q11 and the second region Q12 may be disposed to face each other. Both side surfaces of the first flat portion Q1 may be disposed to face the first region Q11 and the second region Q12.

The second frame 111 may include a region exposed to the groove portion 133A, and may include, for example, a third region Q21 and a fourth region Q22. The third region Q21 and the fourth region Q22 may be spaced apart in the second direction from the outside of the second flat portion Q2. The third and fourth regions Q21 and Q22 may be disposed outside the second direction of the second upper recess 12 and exposed to the bottom of the cavity 102. An interval between the third and fourth regions Q21 and Q22 may be greater than a length in the second direction of the second flat portion Q2. An interval between the third and fourth regions Q21 and Q22 may be smaller than the bottom width a2 of the cavity 102 in the second direction. The third and fourth regions Q21 and Q22 may be parts in which the upper portion of the second frame 113 is exposed from the bottom of the cavity 102. The width a3 in the second direction of the third and fourth regions Q21 and Q22 may be wider than the bottom width of the protection device 125, and may be, for example, 100 micrometers or more, or in a range of 100 to 200 micrometers. The length of the third and fourth regions Q21 and Q22 in the first direction may be longer than the width of the third and fourth regions Q21 and Q22. The third region Q21 and the fourth region Q22 may be disposed to face each other. Both side surfaces of the second flat portion Q2 may be disposed to face the third region Q21 and the fourth region Q22.

In the first and second frames 111 and 112, the first region Q11 and the third region Q21 may correspond to each other, and the second region Q12 and the fourth region Q22 may correspond to each other. The protection device 125 may be disposed on at least one of the first to fourth regions Q11, Q12, Q13, and Q14 of the first and second frames 111 and 112. For example, the protection device 125 may be disposed on the first region Q11 and may be connected to the third region Q21 by a wire 126. The protection device 125 may be electrically connected to the first and second frames 111 and 112.

According to an embodiment, since the first to fourth regions Q11, Q12, Q13, and Q14 of the first and second frames 111 and 112 may be exposed on the bottom of the cavity 102, the second width of the bottom of the cavity 102 made be wider and a space for embedding the protection device 125 may be provided.

The first frame 111 may have hole structures 116 and 117 around the periphery of the first upper recess 11, and the hole structures 116 and 117 may be formed in an outward direction from boundary regions of the first upper recess 11 and may be stably coupled to the reflective portion 110A. The depths of the hole structures 116 and 117 disposed in the first upper recesses 11 may be provided at different depths from portions in contact with the first frame 111 and portions in contact with the first upper recesses 11.

The second frame 113 may have hole structures 118 and 119 around the periphery of the second upper recess 12, and the hole structures 118 and 119 disposed in the first upper recess 11 may be formed in an outward direction from boundary region of the second upper recess 12 and may be stably coupled to the reflective portion 110A. The depths of the hole structures 118 and 119 disposed in the second upper recess 12 may be different from the depths of the portions in contact with the second frame 113 and the portions in contact with the second upper recesses 12.

The hole structures 116, 117, 118 and 119 disposed in the first and second upper recesses 11 and 12 may be disposed at corners of the bottom of the cavity, respectively. Here, when a bottom shape of the cavity is a polygon or ellipse shape, the hole structures 116, 117, 118, and 119 may be disposed at each corner direction of the package body 110. The hole structures 116, 117, 118, and 119 may be holes penetrating from the upper surface of the frame 111, 112 to the lower surface thereof.

Referring to FIGS. 18 to 21, the light emitting device package includes a first side portion 132 of the cavity 102. The first side portion 132 may be disposed around the first flat portion Q1 and the second flat portion Q2. The first side portion 132 may be disposed on the first and second upper recesses 11 and 12. The first side portion 132 may be connected to the body 113 or may be integrally formed. The first side portion 132 may be formed of one body with the body 113 and the reflective portion 110A.

The first side portion 132 may protrude higher than the upper surfaces of the first and second flat portions Q1 and Q2. The first side portion 132 may protrude higher than the upper surface of the body 113 disposed between the first and second flat portions Q1 and Q2. The first side portion 132 may have an open region in which the light emitting device 120 is disposed, and the first and second flat portions Q1 and Q2 may be exposed in the open region. The upper surface of the body 113 between the first and second flat portions Q1 and Q2 may be exposed in the open region of the first side portion 132. The body 113 may overlap with the light emitting device 120 in the third direction. The length a0 in the first direction of the open region may be equal to or greater than the length of the first direction of the light emitting device 120, and may be, for example, 1200 micrometers or more, for example, in the range of 1200 to 1700 micrometers. The length a1 in the second direction of the open region may be smaller than the length a0 in the first direction and may be 1000 micrometers or less, for example, in the range of 900 to 1000 micrometers. The size of the open region may correspond to the size of the light emitting device 120 and may have a difference of 10 to 60 micrometers from the length of each side of the light emitting device 120.

The stepped portion 131 disposed around the outer peripheries of the first and second flat portions Q1 and Q2 is disposed at the first side portion 132, a bottom of the stepped portion 131 may be disposed lower than the lower surface of the light emitting device 120, and the stepped portion 131 may be disposed to overlap the periphery of the lower surface of the light emitting device 120 in the third direction. The bottom of the stepped portion 131 may extend from the first and second flat portions Q1 and Q2 to the same height as the top surface of the flat portions Q1 and Q2. The width b6 of the stepped portion 131 may be disposed in the range of 30 micrometers or more, for example, in a range of 30 to 70 micrometers. Since the width b6 of the stepped portion 131 is disposed in the range, an insertion of the light emitting device 120 overlapping the stepped portion 131 may be guided, and it is possible to prevent foreign substances from occurring on the surfaces of the flat portions Q1 and Q2.

Referring to FIGS. 18 and 21, the first side portion 132 may be disposed along the lower periphery of the light emitting device 120 disposed on the first and second flat portions Q1 and Q2. The upper surface S2 of the first side portion 132 may be disposed as an inclined surface on the lower outer side of the light emitting device 120 disposed on the first and second flat portions Q1 and Q2. The height T0 of the first side portion 132 is 50 micrometers or more, for example, in a range of 50 to 200 micrometers from the upper surfaces S2 of the first and second frames 111 and 112 or the upper surfaces of the flat portions Q1 and Q2. Since the first side portion 132 may face the semiconductor layer 123 on the outside of the light emitting device 120, the first side portion 132 may be reflected the light incident on the side surface of the semiconductor layer 123. Accordingly, the light reflection efficiency may be improved. By protruding the first side portion 132 with the height T0, it is possible to prevent the resin 135 from overflowing to the outside of the first side portion 132. The distance from the light emitting device 120 to the first side portion 132 may gradually increase as the upper portion of the first side portion 132 progresses, thereby improving light reflection efficiency.

The first side portion 132 may include a bottom portion 133 extending in an outward direction along the first and second upper recesses 11 and 12. The bottom portion 133 may be disposed in the first upper recess 11 and may be connected to the reflective portion 110A and the body 113.

The light emitting device package 100 includes a second resin 135. The second resin 135 is disposed around the first side portion 132. The second resin 135 may be disposed on the surface of the first side portion 132. The second resin 135 surrounds the outer periphery of the first side portion 132. The second resin 135 may be disposed on the groove portion 133A. The second resin 135 may be disposed on the bottom portion 133 of the first side portion 132.

The second resin 135 has a reflectance different from that of the first side portion 132. The second resin 135 may be formed of a material different from that of the first side portion 132. The first side portion 132 may include, for example, an epoxy material or a resin material such as PPA, and the second resin 135 may include a silicon material. The second resin 135 may include, for example, at least one of an epoxy-based material, a silicon-based material, a hybrid material including an epoxy-based material and a silicon-based material. The second resin 135 may be made of a material having a higher reflectance than the first side portion 132. Impurities such as at least one metal oxide filler of $TiO_2$, $SiO_2$, and $Al_2O_3$ may be added to the first side portion 132. Impurities such as $TiO_2$, $SiO_2$, and $Al_2O_3$ may be added to the second resin 135. When the same impurities are added to the first side portion 132 and the second resin 135, the impurity content of the second resin 135 may be higher than that of the first side portion 132. The second resin 135 may be made of white silicon.

As shown in FIG. 18, the first side portion 132 and the second resin 135 may be in contact with each other by using a resin material, thereby increasing adhesion. The second resin 135 may be spaced apart from the light emitting device 120. The distance b4 between the second resin 135 and the light emitting device 120 may be spaced apart in a range of 200 micrometers or more, for example, in a range of 200 to 400 micrometers. When the distance b4 is within the above range, the width of the first side portion 132 may be secured to perform a dam function. When the distance b4 is larger than the range, the surface area of the second resin 135 may be reduced. Therefore, the improvement of the light efficiency may be insignificant. The width b3 of the second resin 135 disposed in the groove portion 133A may be disposed in a range of 200 micrometers or more, for example, 200 to 500 micrometers. When the width b3 of the second resin 135 is in the above range, the surface reflectance may be improved and a contact area between the first side portion 132 and the side surface of the cavity may be secured. The width b3 of the second resin 135 may be a straight line distance from the upper or lower portion. The first side portion 132 may be disposed between the second resin 135 and the light emitting device 120 to prevent the second resin 135 from contacting the light emitting device 120. Accordingly, when the second resin 135 is formed around the light emitting device 120, the second resin 135 prevents a problem of forming a fillet along the side surface of the light emitting device 120, thereby reducing light loss.

As shown in FIG. 18, a concave groove portion 133A is disposed between the first side portion 132 and the second side portion 134 of the cavity 102, and the second resin 135 is disposed in the groove portion 133A. The width of the groove portion 133A may be the same as the lower width of the second resin 135. As shown in FIG. 21, the upper surface S3 of the second resin 135 may be connected between a lower part of the upper surface 51 of the second side portion 134 of the cavity 102 and an upper part of the upper surface S2 of the first side portion 132. The inclination angle of the upper surface S2 of the first side portion 132 may be greater than or equal to the inclination angle of the upper surface S3 of the second resin 135. Here, the inclination angle of the upper surface 51 of the second side portion 134 of the cavity 102 may be 40 degrees or more, for example, in a range of 40 to 60 degrees with respect to the straight line in the first direction. Accordingly, the upper surface S2 of the first side portion 132 may effectively reflect the light emitted to the lower portion of the light emitting device 120 by the inclination angle.

As shown in FIG. 15, the second resin 135 may be disposed on the first to fourth regions Q11, Q12, Q13, and Q14 of the first and second frames 111 and 112. The second resin 135 covers the protection device 125 and the wire 126 disposed on the first to fourth regions Q11, Q12, Q13, and Q14. Accordingly, the protection device 125 is embedded in the second resin 135 to reduce the absorption loss of the light emitted from the light emitting device 120.

A height of the upper surface of the second resin 135 may be at least higher than a height of the upper surface of the first side portion 132. The minimum thickness of the second resin 135 may be the depth of the groove portion 133A or the height T0 of the first side portion 132, and the maximum thickness may be the same as a lower part of the side surface of the cavity 102 in the second direction.

The second resin 135 may be disposed to be in non-contact with the first and second flat portions Q1 and Q2 and the light emitting device 120, thereby preventing the light emitting device 120 from being affected. As shown in FIG. 21, the upper surface S3 of the second resin 135 is disposed to be inclined in the inclined direction of the upper surface S2 of the first side portion 132, thereby reflecting light emitted from the light emitting device 120. An upper surface area or width of the second resin 135 may be wider than an upper surface area or width of the first side portion 132. The upper surface area or width of the first side portion 132 may be a portion protruding around the first and second flat portions Q1 and Q2. A part of the second resin 135 may overlap the upper surface (S3 of FIG. 21) of the second side portion 134 of the cavity 102 in the third direction.

Since the first side portion 132, the second side portion 134, and the second resin 135 which are different from each other and have a multiple dam structures are arranged around the light emitting device 120, the side surface of the light emitting device 120 may be exposed from the first side portion 132, the second side portion 134 and the second resin 135, thereby improving the light extraction efficiency and improving the reflection efficiency of the side light of the light emitting device 120.

FIG. 16 is a view excluding the second reflecting unit and the light emitting device from the light emitting device package of FIG. 15. Referring to FIG. 16, the first and second flat portions Q1 and Q2 may have a greater length in the second direction than the width in the first direction. Since the light emitting device 120 has a long length in the long side direction, the first and second flat portions Q1 and Q2 may provide a long length in the short side direction, thereby increasing the bonding area with each bonding portion. The first direction may be a horizontal direction, a long side direction of the package body 110, or a direction in which the two frames 111 and 112 are spaced apart from each other. The second direction may be a longitudinal direction, a short side direction of the package body 110, or a direction in which the body 113 between the two frames 111 and 112 extends.

Referring to FIGS. 15 and 17, the first flat portion Q1 may be disposed under the first bonding portion 121 of the light emitting device 120. The first flat portion Q1 may be provided to overlap the first bonding portion 121 of the light emitting device 120 in the third direction. The first flat portion Q1 may be provided to overlap the first bonding portion 121 of the light emitting device 120 in the third direction from the top surface of the first frame 111 to the lower surface.

A top view shape of the first and second flat portions Q1 and Q2 may have a polygonal shape, an ellipse shape, or a circular shape. The first and second flat portions Q1 and Q2 may have a structure having a curved surface or an inclined surface around the upper portion thereof. Accordingly, the body 113 disposed between the first and second flat portions Q1 and Q2 may have an upper width wider than a lower width.

The second flat portion Q2 may be provided in the second frame 112. The second flat portion Q2 may protrude from the second frame 112. The second flat portion Q2 may be provided to protrude from the upper and lower surfaces of the second frame 112 in the third direction.

An interval between the upper surface of the first flat portion Q1 and the upper surface of the second flat portion Q2 may be greater than or equal to the width of the body 113 and may be provided, for example, 150 micrometers or more, for example, in a range of 150 to 500 micrometers.

Accordingly, an electrical stable distance between the first and second flat portions Q1 and Q2 may be secured. The lower surfaces of the first and second flat portions Q1 and Q2 may be formed as flat surfaces, and may be bonded to the circuit board through the lower surfaces of the first and second frames 111 and 112.

When the light emitting device package 100 according to the embodiment is later mounted on a circuit board or a sub-mount, the interval between the second flat portion Q2 and the second flat portion Q2 on regions of the lower surfaces of the first frame 111 and the second frame 112 may be selected to be provided over a predetermined distance to prevent an electrical short between the pads.

The conductive layer is between the first flat portion Q1 of the first frame 111 and the first bonding portion 121 of the light emitting device 120, and between the second flat portion Q2 of the second frame 113 and the second bonding portion of the light emitting device 120, respectively. The conductive layer may be bonded to the first and second bonding portions 127 and 129 in the upper regions of the first and second flat portions Q1 and Q2. A portion of the conductive layer may be disposed around the lower parts of the first and second flat portions Q1 and Q2. The conductive layer may include one material or alloy selected from the group including Ag, Au, Pt, Sn, Cu, or the like. At least one of the flat portions Q1 and Q2 and the bonding portions 121 and 122 of each of the frames 111 and 112 may be combined with a compound in which a material constituting thereof and the material of the conductive layer is combined. The compound may include at least one of $Cu_xSn_y$, $Ag_xSn_y$, and $Au_xSn_y$, and may satisfy a condition of $0<x<1$, $y=1-x$, and $x>y$.

An intermetallic compound (IMC) may be formed between the conductive layer and the frame 120, during the bonding portions 121 and 122 of the light emitting device 120 with a material constituting the conductive layer is process of forming the conductive layer or the heat treatment process after the conductive layer is provided. For example, the conductive layer may be formed using a conductive paste. The conductive paste may include a solder paste, a silver paste, or the like, and may include a multilayer or a single layer composed of a multilayer or an alloy composed of different materials. For example, the conductive layer may include an SAC (Sn—Ag—Cu) material.

For example, an alloy layer may be formed by bonding between a material constituting the conductive layers and a metal of the frames 111 and 112. Accordingly, the conductive layers 127 and 129 and the frames 111 and 112 may be physically and electrically stably coupled. The conductive layers 127 and 129, the alloy layer and the frame may be combined physically and electrically stably. The alloy layer may include at least one intermetallic compound layer selected from the group including AgSn, CuSn, AuSn, and the like. The intermetallic compound layer may be formed by combining a first material and a second material, the first material may be provided from a conductive layers 127 and 129, and the second material may be provided from the bonding portions 121 and 122 or the frames 111 and 112.

The light emitting device package 101 may be mounted on a sub-mount or a circuit board. However, in the conventional light emitting device package is mounted on the sub-mount or the circuit board, a high temperature process such as a reflow may be applied. At this time, in the reflow process, a re-melting phenomenon occurs in the bonding region between the lead frame and the light emitting device provided in the light emitting device package, thereby weakening the stability of the electrical connection and the physical coupling.

However, the first bonding portion 121 and the second bonding portion 122 of the light emitting device according to the embodiment may be provided with driving power through the flat portions Q1 and Q2 and the conductive layer. The melting point of the conductive layer may be selected to have a higher value than the melting point of other bonding materials. Therefore, since the light emitting device package 101 according to the embodiment does not cause a re-melting phenomenon even when bonded to a main substrate through a reflow process, there is an advantage that electrical connection and physical bonding force may not be degraded. In addition, according to the light emitting device package 101 according to the embodiment, the package body 110 does not need to be exposed to high temperatures in the process of manufacturing the light emitting device package. Therefore, according to the embodiment, the package body 110 may be prevented from being damaged or discolored due to exposure to high temperature.

Accordingly, the selection range for the material constituting the body 113 may be widened. According to an embodiment, the body 113 may be provided using a relatively inexpensive resin material as well as an expensive material such as a ceramic. For example, the body 113 includes at least one material selected from the group consisting of a Polyphthalamide (PPA) resin, a polycyclohexylenedimethylene terephthalate (PCT) resin, an epoxy molding compound (EMC) resin, and a silicone molding compound (SMC) resin.

Referring to FIGS. 18 to 21, the molding portion 140 may be disposed in the cavity 102. The molding portion 140 may be provided on the light emitting device 120, the first side portion 132, and the second resin 135. The molding portion 140 may be disposed on the first frame 111 and the second frame 112. The molding portion 140 may be provided on the side surface of the cavity 102. The molding portion 140 may be disposed on the first side portion 132 and the second resin 135 and may contact the side surface of the light emitting device 120. The molding portion 140 may contact the lower surface of the light emitting device 120.

The molding portion 140 may include an insulating material. In addition, the molding portion 140 may include wavelength conversion means for receiving the light emitted from the light emitting device 120 and providing the wavelength-converted light. For example, the molding portion 140 may be at least one selected from the group including phosphors, quantum dots, and the like. The molding portion 140 may be formed as a single layer or a multilayer, and in the case of a multilayer, any one layer may be free of impurities such as phosphors, and the other layer may have impurities such as phosphors.

According to the embodiment, a half etching process is performed on upper portions of the frames 111 and 112 to form a first dam portion 132 and a second resin 135 having a reflection characteristic having a double dam structure or a continuous loop or frame shape. The problem of inhibiting side light extraction from the light emitting device 120 may be prevented by the first side portion 132 and the second resin 135 having reflective characteristics. Therefore, the light extraction efficiency of the light emitting device package may be improved.

Figure 22:
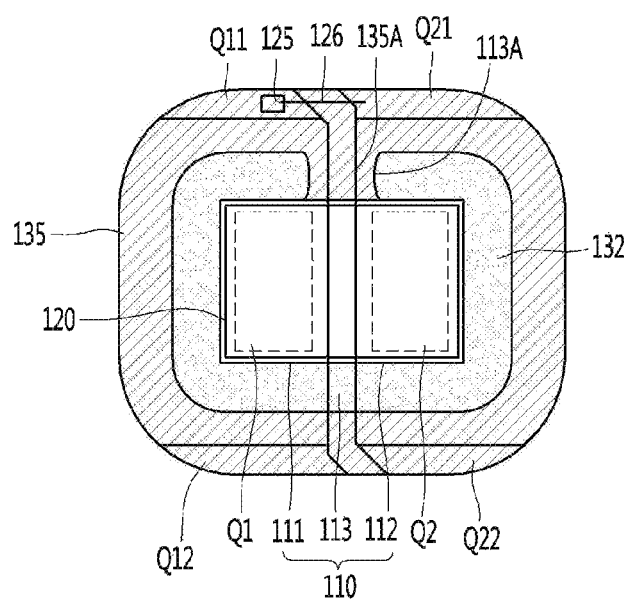
FIG. 22 is a view illustrating a first modified example of the first side of the light emitting device package of FIG. 15.

FIG. 22 illustrates a first modified example of the first side portion of the light emitting device package of FIG. 15. The same configuration as the configuration of the embodiment disclosed above will be referred to the above configuration and description, and detailed description thereof will be omitted.

Referring to FIG. 22, the first side portion 132 may have a shape in which a protruding structure is a discontinuous. A first opening 113A may be disposed in the first side portion 132, and the first opening 113A may overlap the body 113 in the third direction. The width of the first opening 113A in the first direction may be equal to or larger than the width of the body 113. The first opening 113A may be opened in an area between the light emitting device 120 and the first and third regions Q11 and Q21 of the first and second frames 111 and 112. Accordingly, a portion 135A of the second resin 135 disposed around the first side portion 132 may extend through the first opening 113A. The portion 135A of the second resin 135 may be disposed under the light emitting device 120. The portion 135A of the second resin 135 may be disposed between the region between the first and second planar portions Q1 and Q2 and the light emitting device 120. The portion 135A of the second resin 135 may be disposed between the body 113 and the light emitting device 120. In this case, even if the second resin 135 rides on the side surface of the light emitting device 120, the second resin 135 may affect a minute portion, thereby minimizing the influence on other side light extraction. Alternatively, the first opening 113A may be disposed to have the same depth as the first and second upper recesses, and in this case, influence of the portion 135A of the second resin 135 on the side surface of the light emitting device 120 may be minimized.

Figure 23:
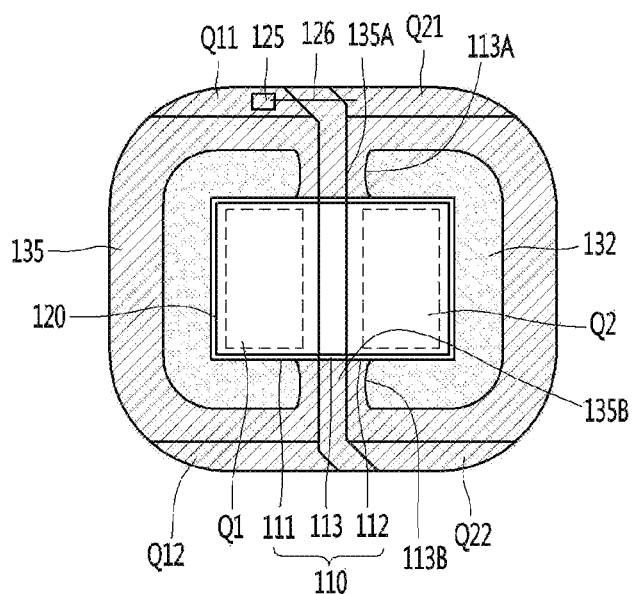
FIG. 23 is a view illustrating a second modified example of the first side of the light emitting device package of FIG. 15.

FIG. 23 illustrates a second modified example of the first side portion of the light emitting device package of FIG. 15. The same configuration as the configuration of the embodiment disclosed above will be referred to the above configuration and description, and detailed description thereof will be omitted.

Referring to FIG. 23, the first side portion 132 may have a shape in which a protruding structure is discontinuous. A plurality of openings may be disposed in the first side portion 132, and the plurality of openings may include first and second openings 113A and 113B disposed on opposite sides of the light emitting device 120. The first and second openings 113A and 113B may overlap the body 113 in the third direction. The width in the first direction of the first and second openings 113A and 113B may be equal to or larger than the width of the body 113 disposed between the frames 111 and 113. The first opening 113A may be opened in an area between the light emitting device 120 and the first and third regions Q11 and Q21 of the first and second frames 111 and 112. The second opening 113B may be opened in an area between the light emitting device 120 and the second and fourth regions Q12 and Q22 of the first and second frames 111 and 112. Accordingly, portions 135A and 135B of the second resin 135 disposed around the first side portion 132 may extend through the first and second openings 113A and 113B. The portions 135A and 135B of the second resin 135 may be disposed under the light emitting device 120. The portions 135A and 135B of the second resin 135 may be disposed between the region between the first and second planar portions Q1 and Q2 and the light emitting device 120. The portion of the second resin 135 may be disposed between the body 113 and the light emitting device 120. In this case, even if the second resin 135 rides on the side surface of the light emitting device 120, the second resin 135 may affect a minute portion, thereby minimizing the influence on other side light extraction. Alternatively, the first and second openings may be disposed to have the same depth as the first and second upper recesses 11 and 12 of FIG. 17, and in this case, a part 135A of the second resin 135 may be disposed. Influence of the portions 135A and 135B of the second resin 135 on the side surface of the light emitting device 120 may be minimized.

Figure 24:
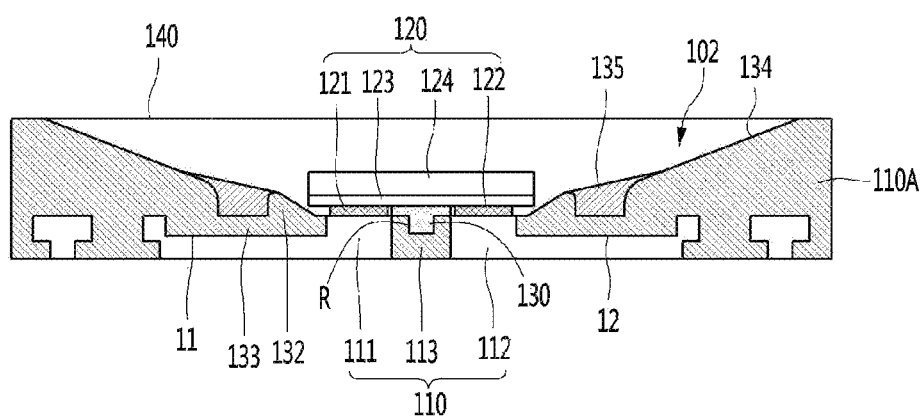
FIG. 24 is a first modified example of the light emitting device package of FIG. 15.
Figure 25:
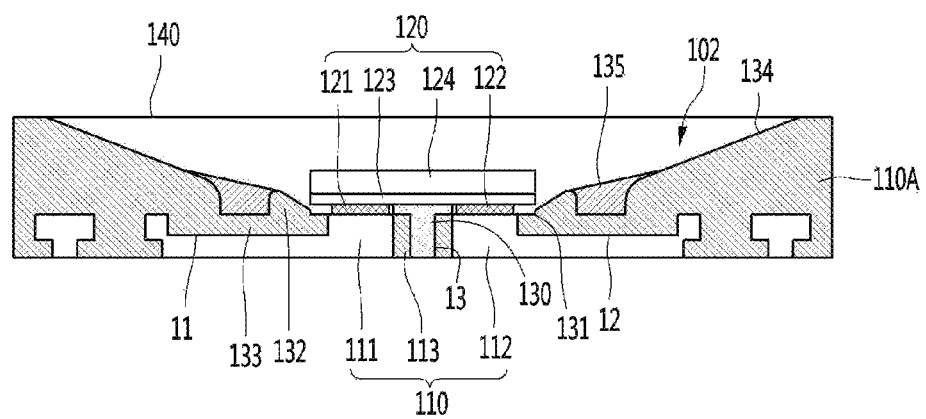
FIG. 25 is a second modified example of the light emitting device package of FIG. 15.

FIGS. 24 and 25 are other examples of the body of the light emitting device package of FIG. 17. In the description of FIGS. 24 and 25, the above-described configuration may be selectively applied, and detailed description thereof will be omitted.

Referring to FIG. 24, the light emitting device package may include a recess R in at least one or both of the frames 111 and 112 and the body 113. The recess R may be provided in the body 113, for example. The recess R may be provided between the first flat portion Q1 and the second flat portion Q2. The recess R may be recessed in a direction of the lower surface from the upper surface of the body 113. The recess R may be disposed under the light emitting device 120. The recess R may overlap the light emitting device 120 in the third direction.

The first resin 130 may be disposed in the recess R. The first resin 130 may be disposed between the light emitting device 120 and the body 113. The first resin 130 may be disposed between the first bonding portion 121 and the second bonding portion 122. For example, the first resin 130 may be disposed in contact with a side surface of the first bonding portion 121 and a side surface of the second bonding portion 122.

The first resin 130 is fixed to the recess R and may provide a stable fixing force between the light emitting device 120 and the package body 110. The area of the first resin 130 bonded to the resin material of the body 113 is increased to provide a stable fixing force between the light emitting device 120 and the body 113. For example, the first resin 130 may be disposed in direct contact with the upper surface of the body 113. In addition, the first resin 130 may be disposed in direct contact with the lower surface of the light emitting device 120.

For example, the first resin 130 may be a reflective material or a light diffusing material, with reference to the materials and functions disclosed in the first embodiment.

According to an embodiment, the depth of the recess R may be smaller than the thickness of the frames 111 and 112. The depth of the recess R may be determined in consideration of the adhesive force of the first resin 130. In addition, the depth of the recess R may be determined so as not to generate cracks in the lighting device package 100 by considering the stable strength of the body 113 and/or the heat emitted from the light emitting device 120.

The recess R may provide a proper space under the light emitting device 120 in which a kind of underfill process may be performed. Here, the underfill process may be a process of disposing the light emitting device 120 on the package body 110 and disposing the first resin 130 under the light emitting device 120. In the process of mounting the light emitting device 120 on the package body 110, the first resin 130 is disposed in the recess R to be mounted the light emitting device through the first resin 130, and then a process of the mounting the light emitting device 120 is disposed. The recess R may be provided to be greater than or equal to a first depth so that the first resin 130 is sufficiently provided between the lower surface of the light emitting device 120 and the upper surface of the body 113. In addition, the recess R may be provided under a second depth in order to provide stable strength of the body 113. The depth of the recess R may be provided from 40 micrometers to 60 micrometers.

The width in the first direction of the recess R may be smaller than the interval between the frames 111 and 112. The width of the recess R may be provided in the long axis direction of the light emitting device 120. The width in the first direction of the recess R may be smaller than the width in the first direction of the flat portions Q1 and Q2. The depth and width of the recess R may be determined so that sufficient fixing force may be provided by the first resin 130 disposed between the body 113 and the light emitting device 120. For example, the width of the recess R may be provided to 140 micrometers to 160 micrometers.

The length of the recess R in the second direction may be longer than the length of the light emitting device 120 in the short axis direction. In this case, the first resin 130 is exposed to the outside of the light emitting device 120 and may be performed the light reflection function. The length of the recess R in the second direction may be smaller than the length of the long axis of the light emitting device 120, and in this case, the lower surface of the light emitting device 120 may be bonded to the first resin 130. The length of the recess R in the second direction may be disposed in the open area of the first side portion 132 or may be in contact with the first side portion 132.

According to the embodiment, the thickness of the first resin 130 may be secured through the interval between the light emitting device 120 and the upper surface of the body 113, thereby enhancing the lower adhesive force and the supporting force of the light emitting device 120. The first resin 130 may be connected to or separated from the second resin 135. The first resin 130 may function as an adhesive. The first resin 130 may be used as a bonding process after adhering the light emitting device 120.

In the light emitting device package according to the embodiment, a recess may be further disposed with the hole structures in the lower portions of the frames 111 and 112 to strengthen the coupling with the body 113. In addition, by arranging the stepped structure in the lower portion of the frames 111 and 112, it is possible to strengthen the coupling with the body 113 and to control the spreading of the solder.

Referring to FIG. 25, the light emitting device package may include through holes in at least one or both of the frames 111 and 112 and the body 113. The through hole 13 may be provided in, for example, the body 113. The through hole 13 may correspond to the through hole 115A provided in FIG. 9.

The through hole 13 may be provided between the first flat portion Q1 and the second flat portion Q2. The through hole 13 may be provided to penetrate from the upper surface of the body 113 to the lower surface. The through hole 13 may be disposed under the light emitting device 120. The through hole 13 may be provided to overlap the light emitting device 120 in the third direction.

The first resin 130 may be disposed in the through hole 13. The first resin 130 may be disposed between the light emitting device 120 and the body 113. The first resin 130 may be disposed between the first bonding portion 121 and the second bonding portion 122. For example, the first resin 130 may be disposed in contact with a side surface of the first bonding portion 121 and a side surface of the second bonding portion 122. When the first resin 130 is formed, the first resin 130 may be formed in the through hole 13 after the support sheet is disposed on the bottom of the package body 110.

The first resin 130 may be disposed on the through hole 13 and the body 113 to provide a stable fixing force between the light emitting device 120 and the package body 110. The area of the first resin 130 bonded to the resin material of the body 113 is increased to provide a stable fixing force between the light emitting device 120 and the body 113. For example, the first resin 130 may be disposed in direct contact with the upper surface of the body 113. In addition, the first resin 130 may be disposed in direct contact with the lower surface of the light emitting device 120.

For example, the first and second resins 130 and 135 may include at least one of an epoxy-based material, a silicon-based material, a hybrid material including an epoxy-based material and a silicon-based material. It may include. As another example, when the first and second resins 130 and 135 include a reflection function, the first and second resins 130 and 135 may include white silicone. The first and second resins 130 and 135 may be formed of a thermally conductive material for dissipating heat downward as well as an adhesive function. In this case, the content of metal oxides may be increased and disposed in the first and second resins 130 and 135. The first and second resins 130 and 135 will be referred to the description of the first embodiment.

According to an embodiment, the depth of the through hole 13 may be equal to the thickness of the frames 111 and 112. The width of the through hole 13 may be determined in consideration of the stable strength of the body 113 and/or to prevent cracks in the light emitting device package due to heat emitted from the light emitting device 120.

The width of the through hole 13 in the first direction may be smaller than the gap between the frames 111 and 112. The width of the through hole 13 may be provided in the long axis direction of the light emitting device 120. The width in the first direction of the through hole 13 may be smaller than the width in the first direction of the flat portions Q1 and Q2. The length of the through hole 13 may be smaller or larger than the length of the light emitting device 120 in the long axis direction, for example, the length of the second direction.

The first resin 130 may strengthen the lower adhesive force and the support force of the light emitting device 120. In addition, the thickness of the first resin 130 may be increased through the interval between the light emitting device 120 and the frames 111 and 112, thereby preventing a short problem on the side surface of the light emitting device 120. In addition, the light reflection efficiency by the first resin 130 may be improved.

Referring to FIGS. 26 to 29 are views illustrating a method of manufacturing the light emitting device package of FIG. 15.

Figure 26:
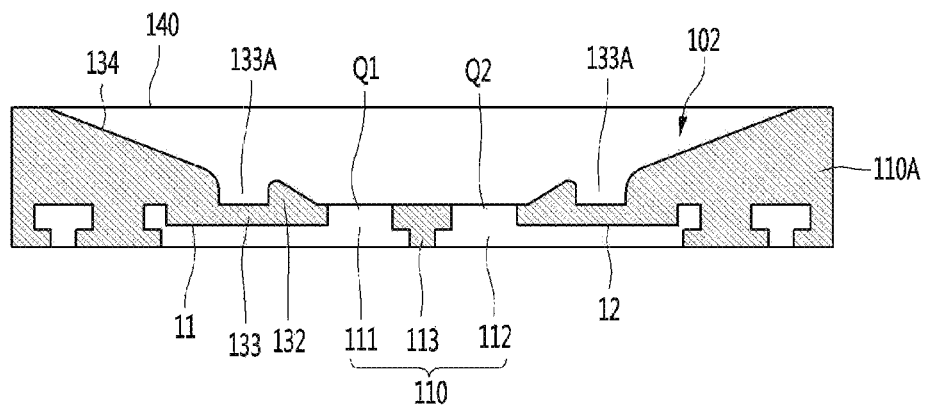
FIGS. 26 to 29 are views illustrating a method of manufacturing the light emitting device package of FIG. 15.

Referring to FIG. 26, the first and second frames 111 and 113 may provide a lower recess in an outer direction of the flat portion. A first side portion 132 may be formed in the lower recess. The first side portion 132 may be connected to or integrally formed with the body 113 disposed between the first and second frames 111 and 112. The first side portion 132 may be connected to or integrally formed with the reflective portion and the body 113. The first side portion 132, the reflective portion and the body 113 may be formed on the frame by an injection molding process.

As shown in FIG. 16, the groove portion between the first side portion 132 and the reflective portion may be formed in a continuous loop shape. The bottom of the groove portion may be disposed at the same height as the upper surfaces of the first and second flat portions Q1 and Q2. That is, the bottom of the connection part of the first side portion 132 is disposed at the same height as the upper surfaces of the first and second flat portions Q1 and Q2, thereby minimizing the step difference on the bottom of the molding die due to the injection molding.

The first side portion 132 may be disposed outside the flat portions of the first and second frames 111 and 112 and may protrude higher than the top surface of the flat portion. The inclination angles of the top surface of the first side portion 132 and the top surface of the second side portion 134 of the cavity may be different from each other. The inclination angle of the upper surface 51 of the first side portion 132 may be different from that the upper surface of the second side portion 134 of the cavity 102. For example, an inclination angle of the top surface 51 of the first side portion 132 may be larger than the inclination angle of the second side portion 134 of the cavity 102. Here, the inclination angle may be an angle inclined based on the bottom of a horizontal package body 110.

Figure 27:
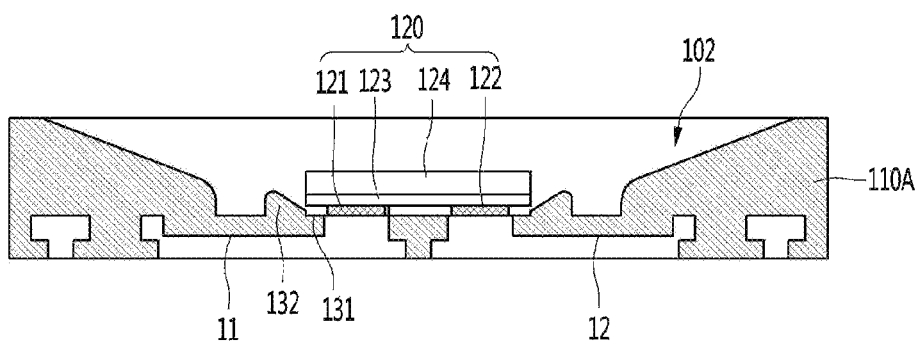
Figure 28:
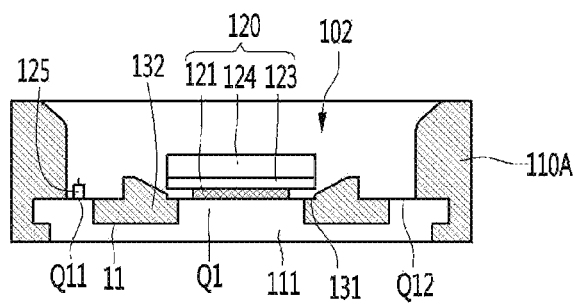

Referring to FIGS. 27 and 28, after facing the first and second bonding portions of the light emitting device 120 on the first and second flat portions Q1 and Q2 of the first and second frames 111 and 112, there may be adhered with by a conductive layer. The conductive layer may be disposed between the first flat portion Q1 of the first frame 111 and the first bonding portion 121 of the light emitting device 120, and between the second flat portion Q2 of the second frame 113 and the second bonding portion of the light emitting device 120. The conductive layer may be bonded to the first and second bonding portions 127 and 129 on an upper region of the first and second flat portions Q1 and Q2, and a portion of the conductive layer may be disposed on a lower periphery of the first and second flat portions Q1 and Q2. The conductive layer may include one material selected from the group including Ag, Au, Pt, Sn, Cu, or an alloy thereof. At least one of the flat portions P1 and P2 and the bonding portions 121 and 122 of each of the frames 111 and 112 may be combined with a compound in which a material constituting the material of the conductive layer is combined. The compound may include at least one of $Cu_xSn_y$, $Ag_xSn_y$, and $Au_xSn_y$, and may satisfy a condition of $0<x<1$, $y=1-x$, and $x>y$.

An intermetallic compound (IMC) may be formed between the conductive layer and the frame 120, during the bonding portions 121 and 122 of the light emitting device 120 with a material constituting the conductive layer is process of forming the conductive layer or the heat treatment process after the conductive layer is provided. For example, the conductive layer may be formed using a conductive paste. The conductive paste may include a solder paste, a silver paste, or the like, and may include a multilayer or a single layer composed of a multilayer or an alloy composed of different materials. For example, the conductive layer may include an SAC (Sn—Ag—Cu) material.

For example, an alloy layer may be formed by bonding between a material constituting the conductive layer and a metal of the frames 111 and 112. Accordingly, the conductive layer and the frames 111 and 112 may be physically and electrically stably coupled. The conductive layer, the alloy layer and the frame may be combined physically and electrically stably. The alloy layer may include at least one intermetallic compound layer selected from the group including AgSn, CuSn, AuSn, and the like. The intermetallic compound layer may be formed by combining a first material and a second material, the first material may be provided from a conductive layer, and the second material may be provided from the bonding portions 121 and 122 or the frames 111 and 112.

The light emitting device package 101 may be mounted on a sub-mount or a circuit board. However, in the conventional light emitting device package is mounted on the sub-mount or the circuit board, a high temperature process such as a reflow may be applied. At this time, in the reflow process, a re-melting phenomenon occurs in the bonding region between the lead frame and the light emitting device provided in the light emitting device package, thereby weakening the stability of the electrical connection and the physical coupling.

However, the first bonding portion 121 and the second bonding portion 122 of the light emitting device according to the embodiment may be provided with driving power through the flat portions Q1 and Q2 and the conductive layer. The melting point of the conductive layer may be selected to have a higher value than the melting point of other bonding materials. Therefore, since the light emitting device package 101 according to the embodiment does not cause a re-melting phenomenon even when bonded to a main substrate through a reflow process, there is an advantage that electrical connection and physical bonding force may not be degraded. In addition, according to the light emitting device package 100 according to the embodiment, the package body 110 does not need to be exposed to high temperatures in the process of manufacturing the light emitting device package. Therefore, according to the embodiment, the package body 110 may be prevented from being damaged or discolored due to exposure to high temperature.

As shown in FIG. 28, the protection device 125 is disposed on the first region Q11 of the first frame 111, and as shown in FIG. 15, and the protection device 125 may connected to the third region Q21 and the wire 126. The first and second regions Q11 and Q12 of the first frame 111 and the third and fourth regions Q21 and Q22 of the second frame 113 refer to the configurations of FIGS. 15, 18 and 19.

Figure 29:
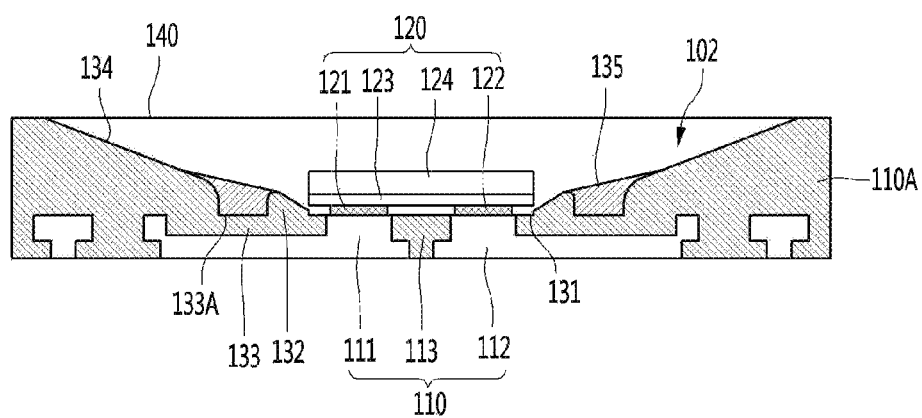

As shown in FIG. 29, the second resin 135 may be disposed in the outer groove portion 133A of the first side portion 132. The second resin 135 may be formed after mounting the protection device 125 and cover the protection device 125. The second resin 135 may be disposed between the first side portion 132 and the surface of the second side portion 134 of the cavity 102 to be spaced apart from the light emitting device 120. The protection device 125 may be implemented as a thyristor, a Zener diode, or a transient voltage suppression (TVS), and the Zener diode protects the light emitting device 120 from an electro static discharge (ESD).

In the light emitting device package, when the second resin 135 is formed, the molding portion 140 may be disposed on the cavity 102. The molding portion 140 may be provided on the light emitting device 120, the first side portion 132, and the second resin 135. The molding portion 140 may be disposed on the first frame 111 and the second frame 112. The molding portion 140 may be provided on the side surface of the cavity 102. The molding portion 140 may be disposed on the first side portion 132 and the second resin 135 and may contact the side surface of the light emitting device 120. The molding portion 140 may contact the bottom surface of the light emitting device 120.

The molding portion 140 may include an insulating material. In addition, the molding portion 140 may include wavelength conversion means for receiving the light emitted from the light emitting device 120 and providing the wavelength-converted light. For example, the molding portion 140 may be at least one selected from the group including phosphors, quantum dots, and the like. The molding portion 140 may be formed as a single layer or a multilayer, and in the case of the multilayer, any one layer may be free of impurities such as phosphors, and the other layer may have impurities such as phosphors.

Figure 30:
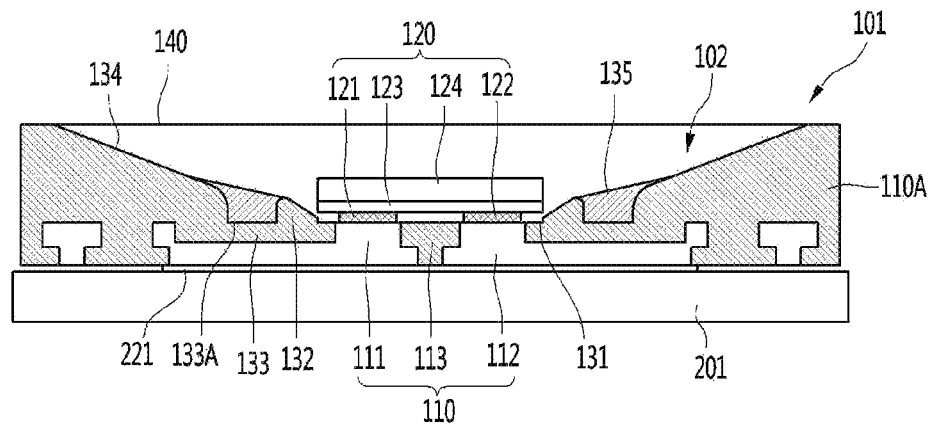
FIG. 30 is an example of a light emitting module having the light emitting device package of FIG. 15.

FIG. 30 is another example of a lighting module having the light emitting device package according to the embodiment.

Referring to FIG. 30, one or more lighting modules may be disposed on the circuit board 201. The circuit board 201 may be provided with a power supply circuit for controlling the driving of the light emitting device 120.

The package body 110 may be disposed on the circuit board 201. The first and second frames 111 and 112 of the light emitting device package 100 may be electrically connected to the circuit board 201 by conductive adhesives 221 and 223. A plurality of pads may be disposed on an upper surface of the circuit board 201, and the pads may be connected to the first and second frames 111 and 112 through the conductive adhesives 221 and 223.

The light emitting device package according to the embodiment, a re-melting phenomenon does not occur even when bonded to the circuit board through a reflow process, so that the electrical connection and physical bonding force are not degraded. According to the light emitting device package according to the embodiment, the package body 110 does not need to be exposed to high temperatures in the process of manufacturing the light emitting device package. Therefore, according to the embodiment, the package body 110 may be prevented from being damaged or discolored due to exposure to high temperature.

The light emitting device package 101 according to the embodiment may be mounted on a sub-mount or the circuit board and supplied. However, in the conventional light emitting device package is mounted on the sub-mount or the circuit board, a high temperature process such as a reflow may be applied. At this time, in the reflow process, a re-melting phenomenon occurs in the bonding region between the frame and the light emitting device provided in the light emitting device package, thereby weakening the stability of the electrical connection and the physical coupling. The light emitting device package 101 according to the embodiment has an advantage in that the electrical connection and the physical bonding force are not degraded because re-melting does not occur even when the main substrate is bonded through a reflow process.

The light emitting device package according to the embodiment of the present invention may include the configuration of the first embodiment and the configuration of the second embodiment. For example, the light emitting device package may include a protruding portion of the frame shown in FIG. 4 and an upper recess shown in FIG. 18. In addition, the flat portion of the second embodiment may be disposed on the protruding portion of the first embodiment. For example, the light emitting device package may apply the protection device shown in FIG. 15 and the structure in which the protection device is disposed in the first embodiment.

Figure 31:
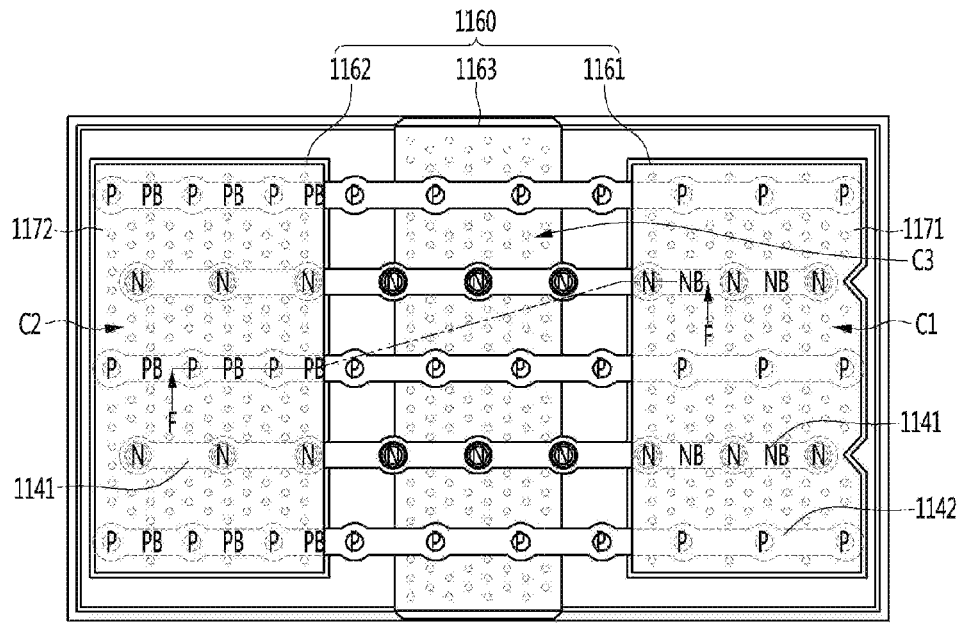
FIG. 31 is a plan view illustrating an example of a light emitting device applied to a light emitting device package according to an embodiment (s) of the present invention.
Figure 32:
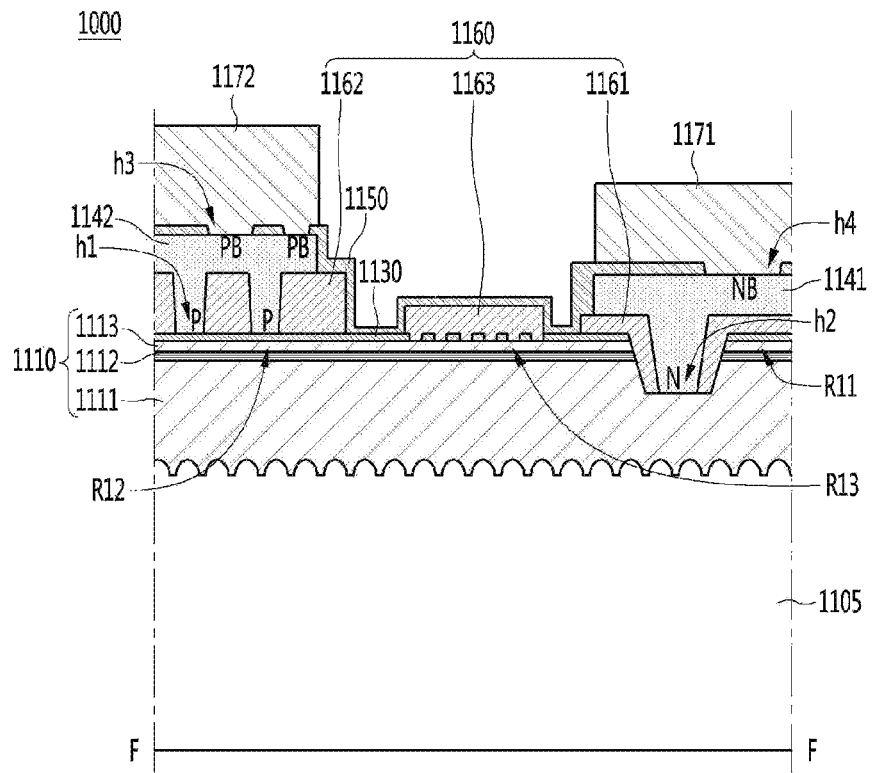
FIG. 32 is a cross-sectional view taken along line F-F of the light emitting device of FIG. 31.

FIG. 31 is a plan view illustrating a light emitting device according to an embodiment of the present invention, and FIG. 32 is a cross-sectional view taken along line F-F of the light emitting device shown in FIG. 31.

Referring to FIG. 31, the first sub-electrode 1141 and the second bonding are disposed under the first bonding portion 1171 and the second bonding portion 1172, but are electrically connected to the first bonding portion 1171. A second sub-electrode 1142 electrically connected to the portion 1172 is shown to be visible.

As shown in FIG. 32, the light emitting device 1100 according to the embodiment may include a light emitting structure 1110 disposed on a substrate 1105. The substrate 1105 and the light emitting structure 1110 may correspond to the substrate 124 and the semiconductor layer 123 of the light emitting device 120 disclosed in the first and second embodiments, respectively.

The substrate 1105 may be selected from the group including a sapphire substrate (Al2O3), SiC, GaAs, GaN, ZnO, Si, GaP, InP and Ge. For example, the substrate 1105 may be provided as a patterned sapphire substrate (PSS) formed on an upper surface thereof with a concavo-convex pattern.

The light emitting structure 1110 may include a first conductive semiconductor layer 1111, an active layer 1112, and a second conductive semiconductor layer 1113. The active layer 1112 may be disposed between the first conductive semiconductor layer 1111 and the second conductive semiconductor layer 1113. For example, the active layer 1112 may be disposed on the first conductive semiconductor layer 1111, and the second conductive semiconductor layer 1113 may be disposed on the active layer 1112.

The light emitting device 1100 according to the embodiment may include a transparent electrode layer 1130. The transparent electrode layer 1130 may increase light output by improving a current diffusion. For example, the transparent electrode layer 1130 may include at least one selected from the group including a metal, metal oxide, and metal nitride. The transparent electrode layer 1130 may include a light transmissive material. The transparent electrode layer 1130 may include selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

The light emitting device 1100 according to the embodiment may include a reflective layer 1160. The reflective layer 1160 may include a first reflective layer 1161, a second reflective layer 1162, and a third reflective layer 1163. The reflective layer 1160 may be disposed on the transparent electrode layer 1130. The second reflective layer 1162 may include a first opening h1 for exposing the transparent electrode layer 1130. The second reflective layer 1162 may include a plurality of first openings h1 disposed on the transparent electrode layer 1130. The first reflective layer 1161 may include second openings h2 for exposing an upper surface of the first conductive semiconductor layer 1111.

The third reflective layer 1163 may be disposed between the first reflective layer 1161 and the second reflective layer 1162. For example, the third reflective layer 1163 may be connected to the first reflective layer 1161. In addition, the third reflective layer 1163 may be connected to the second reflective layer 1162. The third reflective layer 1163 may be disposed while physically making direct contact with the first reflective layer 1161 and the second reflective layer 1162.

The reflective layer 1160 according to the embodiment may make contact with the second conductive semiconductor layer 1113 through contact holes provided in the transparent electrode layer 1130. The reflective layer 1160 may physically make contact with an upper surface of the second conductive semiconductor layer 1113 through the contact holes provided in the transparent electrode layer 1130.

The reflective layer 1160 may be provided as an insulating reflective layer. For example, the reflective layer 1160 may be provided as a distributed Bragg reflector (DBR) layer. In addition, the reflective layer 1160 may be provided as an omni-directional reflector (ODR) layer. In addition, the reflective layer 1160 may be provided by stacking the DBR layer and the ODR layer.

The light emitting device 1100 according to the embodiment may include the first sub-electrode 1141 and the second sub-electrode 1142. The first sub-electrode 1141 may be electrically connected to the first conductive semiconductor layer 1111 in the second opening h2. The first sub-electrode 1141 may be disposed on the first conductive semiconductor layer 1111. For example, according to the light emitting device 1100 of the embodiment, the first sub-electrode 1141 may be disposed on the upper surface of the first conductive semiconductor layer 1111 within the recess disposed to a partial region of the first conductive semiconductor layer 1111 through the second conductive semiconductor layer 1113 and the active layer 1112.

The first sub-electrode 1141 may be electrically connected to the upper surface of the first conductive semiconductor layer 1111 through the second opening h2 provided in the first reflective layer 1161. The second opening h2 and the recess may vertically overlap each other. For example, the first sub-electrode 1141 may make direct contact with the upper surface of the first conductive semiconductor layer 1111 in recess regions.

The second sub-electrode 1142 may be electrically connected to the second conductive semiconductor layer 1113. The second sub-electrode 1142 may be disposed on the second conductive semiconductor layer 1113. According to the embodiment, the transparent electrode layer 1130 may be disposed between the second sub-electrode 1142 and the second conductive semiconductor layer 1113.

The second sub-electrode 1142 may be electrically connected to the second conductive semiconductor layer 1113 through the first opening h1 provided in the second reflective layer 1162. For example, the second sub-electrode 1142 may be electrically connected to the second conductive semiconductor layer 1113 through the transparent electrode layer 1130 in P regions.

The second sub-electrode 1142 may make direct contact with an upper surface of the transparent electrode layer 1130 through a plurality of first openings h1 provided in the second reflective layer 1162 in the P regions. According to the embodiment, the first sub-electrode 1141 and the second sub-electrode 1142 may have polarities to each other and may be spaced apart from each other.

The first sub-electrode 1141 and the second sub-electrode 1142 may be formed with a structure having a single layer or multiple layers. For example, the first sub-electrode 1141 and the second sub-electrode 1142 may be ohmic electrodes. For example, the first sub-electrode 1141 and the second sub-electrode 1142 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf A region R11, R12 and R13 in FIG. 32 shows to distinguish overlapping regions for each of the sub-electrodes.

The light emitting device 1100 according to the embodiment may include a protective layer 1150. The protective layer 1150 may include third openings h3 for exposing the second sub-electrode 1142. The third openings h3 may be disposed corresponding to PB regions provided in the second sub-electrode 1142. In addition, the protective layer 1150 may include fourth openings h4 for exposing the first sub-electrode 1141. The fourth openings h4 may be disposed corresponding to NB regions provided in the first sub-electrode 1141. The protective layer 1150 may be disposed on the reflective layer 1160. The protective layer 1150 may be disposed on the first reflective layer 1161, the second reflective layer 1162, and the third reflective layer 1163. For example, the protective layer 1150 may be provided as an insulating material. For example, the protective layer 1150 may be formed of at least one material selected from the group including SixOy, SiOxNy, SixNy, and AlxOy.

The light emitting device 1100 according to the embodiment may include the first bonding portion 1171 and the second bonding portion 1172 disposed on the protective layer 1150. The first bonding portion 1171 may be disposed on the first reflective layer 1161. In addition, the second bonding portion 1172 may be disposed on the second reflective layer 1162. The second bonding portion 1172 may be spaced apart from the first bonding portion 1171. The first bonding portion 1171 may make contact with an upper surface of the first sub-electrode 1141 through the fourth openings h4 provided in the protective layer 1150 in the NB regions. The NB regions may be vertically offset with the second opening h2. When the plurality of NB regions and the second opening h2 are vertically offset from each other, a current injected into the first bonding portion 1171 may be uniformly distributed in a horizontal direction of the first sub-electrode 1141, thus the current may be uniformly injected in the NB regions.

In addition, the second bonding portion 1172 may make contact with an upper surface of the second sub-electrode 1142 through the third openings h3 provided in the protective layer 1150 in the PB regions. When the PB regions and the first openings h1 are not vertically overlapped with each other, a current injected into the second bonding portion 1172 may be uniformly distributed in a horizontal direction of the second sub-electrode 1142, thus the current may be uniformly injected in the PB regions. Thus, according to the embodiment, because the power may be supplied through the regions, a current dispersion effect can be generated and an operating voltage can be reduced according to the increase of a contact area and the dispersion of a contact region.

Accordingly, the first reflective layer 1161 and the second reflective layer 1162 reflect light emitted from the active layer 1112 of the light emitting structure 1110 to minimize the optical absorption in the first sub-electrode 1141 and the second sub-electrode 1142, so that light intensity Po can be improved. The first reflective layer 1161 and the second reflective layer 1162 may have a DBR structure in which materials having different refractive indexes are alternately disposed. For example, the first reflective layer 1161 and the second reflective layer 1162 may be disposed in a single layer or a stacked structure including at least one of TiO2, SiO2, Ta2O5, and HfO2. Without the limitation thereto, according to another embodiment, the first reflective layer 1161 and the second reflective layer 1162 may freely selected to adjust the reflectivity to the light emitted from the active layer 1112 according to a wavelength of the light emitted from the active layer 1112. In addition, according to another embodiment, the first reflective layer 1161 and the second reflective layer 1162 may be provided as the ODR layer. According to still another embodiment, the first reflective layer 1161 and the second reflective layer 1162 may be provided as a sort of hybrid type in which the DBR layer and the ODR layer are stacked.

When the light emitting device according to the embodiment is implemented as a light emitting device package after being mounted by a flip chip bonding scheme, light provided from the light emitting structure 1110 may be emitted through the substrate 1105. The light emitted from the light emitting structure 1110 may be reflected by the first reflective layer 1161 and the second reflective layer 1162 and emitted toward the substrate 1105.

In addition, the light emitted from the light emitting structure 1110 may be emitted in the lateral direction of the light emitting structure 1110. In addition, the light emitted from the light emitting structure 1110 may be emitted to the outside through a region where the third reflective layer 1163 is not provided among the surfaces on which the first bonding portion 1171 and the second bonding portion 1172 are disposed.

Accordingly, the light emitting device 1100 according to the embodiment may emit the light in six-surfaced directions surrounding the light emitting structure 1110, and remarkably improve the light intensity.

Meanwhile, according to the light emitting device of the embodiment, when viewed from the top of the light emitting device 1100, the sum of the areas of the first bonding portion 1171 and the second bonding portion 1172 is less than or equal to 60% of the total area of the upper surface of the light emitting device 1100 on which the first bonding portion 1171 and the second bonding portion 1172 are disposed.

For example, the total area of the upper surface of the light emitting device 1100 may correspond to the area defined by a lateral length and a longitudinal length of the lower surface of the first conductive semiconductor layer 1111 of the light emitting structure 1110. In addition, the total area of the upper surface of the light emitting device 1100 may correspond to the area of an upper surface or a lower surface of the substrate 1105.

Accordingly, the sum of the areas of the first bonding portion 1171 and the second bonding portion 1172 is equal to or less than 60% of the total area of the light emitting device 1100, so that the amount of light emitted to the surface on which the first bonding portion 1171 and the second bonding portion 1172 are disposed may be increased. Thus, according to the embodiment, because the amount of the light emitted in the six-surfaced directions of the light emitting device 1100 is increased, the light extraction efficiency may be improved and the light intensity Po may be increased.

In addition, when viewed from the top of the light emitting device, the sum of the areas of the first bonding portion 1171 and the second bonding portion 1172 is equal to or greater than 30% of the total area of the light emitting device 1100.

Accordingly, the sum of the areas of the first bonding portion 1171 and the second bonding portion 1172 is equal to or greater than 30% of the total area of the light emitting device 1100, so that a stable mount may be performed through the first bonding portion 1171 and the second bonding portion 1172, and electrical characteristics of the light emitting device 1100 may be ensured.

The sum of the areas of the first bonding portion 1171 and the second bonding portion 1172 may be selected as 30% to 60% with respect to the total area of the light emitting device 1100 in consideration of ensuring the light extraction efficiency and the bonding stability.

In other words, when the sum of the areas of the first bonding portion 1171 and the second bonding portion 1172 is 30% to 100% with respect to the total area of the light emitting device 1100, the electrical characteristics of the light emitting device 1100 may be ensured and bonding strength to be mounted on the light emitting device package may be ensured, so that stable mount may be performed.

In addition, when the sum of the areas of the first bonding portion 1171 and the second bonding portion 1172 is more than 0% and equal to or less than 60% of the total area of the light emitting device 1100, the amount of light emitted to the surface on which the first bonding portion 1171 and the second bonding portion 1172 are disposed increases, so that the light extraction efficiency of the light emitting device 1100 may be improved and the light intensity Po may be increased.

In the embodiment, the sum of the areas of the first bonding portion 1171 and the second bonding portion 1172 is selected as 30% to 60% of the total area of the light emitting device 1100 so as to ensure the electrical characteristics of the light emitting device 1100 and the bonding strength to be mounted on the light emitting device package and increase the light intensity.

In addition, according to the light emitting device 1100 of the embodiment, the third reflective layer 1163 may be disposed between the first bonding portion 1171 and the second bonding portion 1172. For example, the length W5 of the third reflective layer 1163 in major axial direction of the light emitting device 1100 may correspond to the distance between the first bonding portion 1171 and the second bonding portion 1172. In addition, for example, the area of the third reflective layer 1163 may be 10% to 25% of the entire upper surface of the light emitting device 1100.

When the area of the third reflective layer 1163 is 10% or more of the entire upper surface of the light emitting device 1100, the package body disposed under the light emitting device may be prevented from being discolored or cracked. When being 25% or less, it is advantageous to ensure the light extraction efficiency for emitting light to six surfaces of the light emitting device.

In addition, without limited thereto in another embodiment, the area of the third reflective layer 1163 may be arranged to more than 0% and less than 10% of the entire upper surface of the light emitting device 1100 to ensure the light extraction efficiency more, and the area of the third reflective layer 1163 may be arranged to more than 25% and less than 100% of the entire upper surface of the light emitting device 1100 to prevent the package body from being discolored or cracked.

In addition, the light generated from the light emitting structure 1110 may be transmitted and emitted through a second region provided between a side surface arranged in the major axial direction and the first bonding portion 1171 or the second bonding portion 1172 adjacent to the side surface.

In addition, the light generated from the light emitting structure 1110 may be transmitted and emitted through a third region provided between a side surface arranged in a minor axial direction and the first bonding portion 1171 or the second bonding portion 1172 adjacent to the side surface.

According to the embodiment, the size of the first reflective layer 1161 may be several micrometers larger than the size of the first bonding portion 1171. For example, the area of the first reflective layer 1161 may be provided in a size to completely cover the area of the first bonding portion 1171. In consideration of a process error, for example, the length of one side of the first reflective layer 1161 may be greater than the length of one side of the first bonding portion 1171 by about 4 micrometers to about 10 micrometers.

In addition, the size of the second reflective layer 1162 may be several micrometers larger than the size of the second bonding portion 1172. For example, the area of the second reflective layer 1162 may be provided in a size to completely cover the area of the second bonding portion 1172. In consideration of a process error, for example, the length of one side of the second reflective layer 1162 may be greater than the length of one side of the second bonding portion 1172 by about 4 micrometers to about 10 micrometers.

According to the embodiment, light emitted from the light emitting structure 1110 may be reflected without being incident on the first bonding portion 1171 and the second bonding portion 1172 by the first reflective layer 1161 and the second reflective layer 1162. Thus, according to the embodiment, a loss of the light generated and emitted from the light emitting structure 1110 and incident to the first bonding portion 1171 and the second bonding portion 1172 may be minimized.

In addition, according to the light emitting device 1100 of the embodiment, because the third reflective layer 1163 is disposed between the first bonding portion 1171 and the second bonding portion 1172, the amount of light emitted between the first bonding portion 1171 and the second bonding portion 1172 may be adjusted.

As described above, the light emitting device 1100 according to the embodiment may be provided as a light emitting device package after being mounted, for example, in a flip chip bonding scheme. Herein, when the package body mounted thereon with the light emitting device 1100 is provided with resin or the like, the package body is discolored or cracked in the lower region of the light emitting device 1100 due to strong short-wavelength light emitted from the light emitting device 1100.

However, according to the light emitting device 1100 of the embodiment, because the amount of light emitted between the region on which the first bonding portion 1171 and the second bonding portion 1172 are disposed is adjusted, the package body disposed in the lower region of the light emitting device 1100 may be prevented from being discolored or cracked.

According to the embodiment, the light generated from the light emitting structure 1100 may be transmitted and emitted through 20% or more of the area of the upper surface of the light emitting device 1100 on which the first bonding portion 1171, the second bonding portion 1172 and the third reflective layer 1163.

Thus, according to the embodiment, because the amount of the light emitted in the six-surfaced directions of the light emitting device 1100 is increased, the light extraction efficiency may be improved and the light intensity Po may be increased. In addition, the package body disposed adjacent to the lower surface of the light emitting device 1100 may be prevented from being discolored or cracked.

In addition, according to the light emitting device 1100 of the embodiment, a plurality of contact holes C1, C2, and C3 may be provided in the transparent electrode layer 1130. The second conductive semiconductor layer 1113 may be bonded to the reflective layer 1160 through the plurality of contact holes C1, C2, and C3 provided in the transparent electrode layer 1130. The reflective layer 1160 makes directly contact with the second conductive semiconductor layer 1113, so that the adhesive strength may be improved as compared with the case that the reflective layer 1160 makes contact with the transparent electrode layer 1130.

When the reflective layer 1160 makes direct contact with only the transparent electrode layer 1130, the bonding strength or adhesive strength between the reflective layer 1160 and the transparent electrode layer 1130 may be weakened. For example, when an insulating layer is bonded to a metal layer, the bonding strength or adhesive strength between the materials thereof may be weakened.

For example, when the bonding strength or adhesive strength between the reflective layer 1160 and the transparent electrode layer 1130 is weak, peeling may incur between the two layers. Thus, when the peeling incurs between the reflective layer 1160 and the transparent electrode layer 1130, the characteristics of the light emitting device 1100 may deteriorate and the reliability of the light emitting device 1100 may not be ensured.

However, according to the embodiment, because the reflective layer 1160 can make direct contact with the second conductive semiconductor layer 1113, the bonding strength and adhesive strength may be stably provided between the reflective layer 1160, the transparent electrode layer 1130, and the second conductive semiconductor layer 1113.

Thus, according to the embodiment, because the bonding strength between the reflective layer 1160 and the second conductive semiconductor layer 1113 may be stably provided, the reflective layer 1160 may be prevented from being peeled off from the transparent electrode layer 1130. In addition, because the bonding strength between the reflective layer 1160 and the second conductive semiconductor layer 1113 may be stably provided, the reliability of the light emitting device 1100 may be improved.

Meanwhile, as described above, the transparent electrode layer 1130 may be provided with the contact holes C1, C2, and C3. The light emitted from the active layer 1112 may be incident to and reflected by the reflective layer 1160 through the contact holes C1, C2, and C3 provided in the transparent electrode layer 1130. Accordingly, the loss of the light generated from the active layer 1112 and incident to the transparent electrode layer 1130 is reduced, so that the light extraction efficiency may be improved. Thus, according to the light emitting device 1100 of the embodiment, the light intensity may be improved.

As described above, according to the semiconductor device package and the method of manufacturing a semiconductor device package of an embodiment, the bonding portions of the light emitting device 120 of the embodiment may be receive by driving power supplied through the conducive layer which is disposed at the opening. In addition, the melting point of the conductive layer disposed in the opening may be selected to have a higher value than the melting point of a conventional bonding material. Therefore, even when the light emitting device package 100 according to an embodiment is bonded to a main substrate through a reflow process, since re-melting phenomenon does not occur, the electrical connection and physical bonding force are not deteriorated.

In addition, according to the light emitting device package 100 of an embodiment, the package body 110 does not need to be exposed to a high temperature in the process of manufacturing a light emitting device package. Therefore, according to the embodiment, the package body may be prevented from being exposed to high temperatures to be damaged or discolored. Accordingly, the selection range for the material constituting the body 115 may be widened. According to an embodiment, the body may be provided by using a relatively inexpensive resin material as well as an expensive material such as ceramic.

Meanwhile, the light emitting device package according to an embodiment may be applied to a light source unit.

In addition, the light source unit may include a display device, a lighting device, a head lamp, and the like according to an industrial field. As an example of the light source unit, a display device may include a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may have a structure in which light emitting devices that emit red, green and blue light are disposed, respectively.

As still another example of the light source unit, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source unit, the lighting device may include a cover, a light source module, a heat radiator, a power supply, an inner case, and a socket. In addition, the light source unit according to an embodiment may further include at least one of a member and a holder. The light source module may include a light emitting device package according to an embodiment.

Features, structures, effects, etc. described in the above embodiments are included in at least one embodiment, but are not necessarily limited to one embodiment. Furthermore, the features, structures, effects, and the like shown in the embodiments may be combined or modified with respect to other embodiments by those skilled in the art to which the embodiments belong. Therefore, it should be interpreted that the contents related to such a combination and modification are included in the scope of the embodiments.

Although embodiments have been described with reference to a number of illustrative embodiments thereof, it should be understood that numerous other modifications and embodiments can be devised by those skilled in the art that will fall within the spirit and scope of the principles of this disclosure. For example, each component specifically shown in the embodiment may be modified. And differences related to such modifications and applications will have to be construed as being included in the scope of the embodiments set forth in the appended claims.

What is claimed is:

1. A light emitting device package comprising:
   first and second frames spaced apart from each other;
   a body disposed between the first and second frames;
   a light emitting device including a first bonding portion and a second bonding portion on a lower portion;
   a reflective portion including a cavity having an open upper portion;
   a first resin disposed between the body and the light emitting device,
   wherein the first frame includes a first protruding portion facing the first bonding portion of the light emitting device, and
   wherein the second frame includes a second protruding portion facing the second bonding portion of the light emitting device;
   a first conductive layer between the first bonding portion and the first protruding portion; and
   a second conductive layer between the second bonding portion and the second protruding portion,
   wherein the light emitting device is disposed in the cavity,
   wherein side surfaces of the cavity are spaced apart from side surfaces of the light emitting device,
   wherein the first frame includes an upper flat surface and the first protruding portion protrudes above the upper flat surface of the first frame such that an upper surface of the first protruding portion directly contacts the first bonding portion, and
   wherein the first conductive layer is disposed on side surfaces of the first protruding portion and directly contacts the first bonding portion.

2. The light emitting device package of claim 1, wherein upper regions of the first and second protruding portions facing the first and second bonding portions have a horizontal plane, and
   wherein the first and second protruding portions have an inclined side surface or a curved surface around the upper region.

3. The light emitting device package of claim 1, wherein an upper region of the first protruding portion has a width in a first direction smaller than a length in a second direction,
   wherein the light emitting device has a length in the first direction greater than the length in the second direction, and
   wherein the second direction is a direction orthogonal to the first direction.

4. The light emitting device package of claim 3, wherein a distance between upper regions of the first and second protruding portions and the body is equal to a width in the first direction in upper regions of the first and second protruding portions.

5. The light emitting device package of claim 4, wherein the width in the first direction in the upper regions of the first and second protruding portions is equal to a thickness of the first and second frames.

6. The light emitting device package of claim 3, wherein a lower surface of each of the first and second frames has a concave portion recessed in a third direction toward upper surfaces of the first and second frames, respectively,
   wherein the concave portions of the first and second frames overlap the first and second protruding portions in a vertical direction,
   wherein the vertical direction is the third direction, and
   wherein a height of the first and second protruding portions is equal to a depth of the concave portions of the first and second frames.

7. The light emitting device package of claim 1, further comprising:
   a recess or a through hole disposed in the body,
   wherein the first resin is disposed in the recess or the through hole, and
   wherein the first resin contacts the light emitting device.

8. The light emitting device package of claim 1, wherein the first protruding portion and the first bonding portion are connected to each other in the first resin, and
   wherein the second protruding portion and the second bonding portion are connected to each other in the first resin.

9. The light emitting device package of claim 1, wherein a lower surface of the reflective portion and a lower surface of the body are disposed on a same plane as a lower surfaces of the first and second frames, and
   wherein the reflective portion and the body is formed of a same insulating material.

10. The light emitting device package of claim 1, wherein an upper surface of the first protruding portion and an upper surface of the second protruding portion protrude higher than a lower surface of the first resin.

11. The light emitting device package of claim 1, wherein the first frame includes a first extension portion protruding toward a first side of the reflective portion,
   wherein the second frame includes a second extension portion protruding toward the second side of the reflective portion, wherein a thickness of the first extension portion is a same as a thickness of the first protruding portion, and wherein a thickness of the second extension portion is a same as a thickness of the second protruding portion.

12. The light emitting device package of claim 1, further comprising:

a molding portion in the cavity; and a semiconductor layer in the light emitting device and a substrate on the semiconductor layer, wherein the molding portion contacts an upper surface of the first resin and the light emitting device, and wherein the upper surface of the first resin is disposed lower than the substrate of the light emitting device.

\* \* \* \* \*